US010819290B2

(12) United States Patent
Ranta et al.

(10) Patent No.: US 10,819,290 B2
(45) Date of Patent: *Oct. 27, 2020

(54) POWER AMPLIFIER SELF-HEATING COMPENSATION CIRCUIT

(71) Applicant: pSemi Corporation, San Diego, CA (US)

(72) Inventors: Tero Tapio Ranta, San Diego, CA (US); Keith Bargroff, San Diego, CA (US); Christopher C. Murphy, Lake Zurich, IL (US); Robert Mark Englekirk, Littleton, CO (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/253,115

(22) Filed: Jan. 21, 2019

(65) Prior Publication Data

US 2019/0173433 A1 Jun. 6, 2019

Related U.S. Application Data

(63) Continuation of application No. 15/908,533, filed on Feb. 28, 2018, now Pat. No. 10,305,433, which is a
(Continued)

(51) Int. Cl.
*H03F 1/30* (2006.01)
*H03F 1/56* (2006.01)
(Continued)

(52) U.S. Cl.
CPC ............. *H03F 1/30* (2013.01); *G05F 3/26* (2013.01); *H03F 1/56* (2013.01); *H03F 3/195* (2013.01);
(Continued)

(58) Field of Classification Search
USPC .................. 330/284, 285, 296, 289, 311
See application file for complete search history.

(56) References Cited

U.S. PATENT DOCUMENTS

| 4,749,889 A | 6/1988 | Lagoni et al. |
| 6,790,116 B2 | 9/2004 | Inahashi |
| (Continued) | | |

FOREIGN PATENT DOCUMENTS

| EP | 1615337 | 1/2006 |
| EP | 1869785 | 12/2007 |
| (Continued) | | |

OTHER PUBLICATIONS

Nguyen, Hieu P., Office Action received from the USPTO dated Oct. 12, 2018 for U.S. Appl. No. 15/908,533, 6 pgs.
(Continued)

*Primary Examiner* — Hieu P Nguyen
(74) *Attorney, Agent, or Firm* — Jaquez Land Greenhaus LLP; John Land, Esq.

(57) ABSTRACT

Temperature compensation circuits and methods for adjusting one or more circuit parameters of a power amplifier (PA) to maintain approximately constant Gain versus time during pulsed operation sufficient to substantially offset self-heating of the PA. Some embodiments compensate for PA Gain "droop" due to self-heating using a Sample and Hold (S&H) circuit. The S&H circuit samples and holds an initial temperature of the PA at commencement of a pulse. Thereafter, the S&H circuit generates a continuous measurement that corresponds to the temperature of the PA during the remainder of the pulse. A Gain Control signal is generated that is a function of the difference between the initial temperature and the operating temperature of the PA as the PA self-heats for the duration of the pulse. The Gain Control signal is
(Continued)

applied to one or more adjustable or tunable circuits within a PA to offset the Gain droop of the PA.

14 Claims, 20 Drawing Sheets

Related U.S. Application Data continuation-in-part of application No. 15/445,811, filed on Feb. 28, 2017, now Pat. No. 10,056,874.

(51) Int. Cl.
| | |
|---|---|
| *H03F 3/24* | (2006.01) |
| *H03F 3/195* | (2006.01) |
| *H03F 3/213* | (2006.01) |
| *H03F 3/45* | (2006.01) |
| *G05F 3/26* | (2006.01) |

(52) U.S. Cl.
CPC .............. *H03F 3/213* (2013.01); *H03F 3/245* (2013.01); *H03F 3/45076* (2013.01); *H03F 2200/408* (2013.01); *H03F 2200/411* (2013.01); *H03F 2200/447* (2013.01); *H03F 2200/451* (2013.01); *H03F 2200/462* (2013.01); *H03F 2200/468* (2013.01); *H03F 2200/471* (2013.01); *H03F 2200/474* (2013.01); *H03F 2203/45596* (2013.01)

(56) References Cited

U.S. PATENT DOCUMENTS

| | | | |
|---|---|---|---|
| 7,369,820 B2 | 5/2008 | Rahman | |
| 7,729,727 B2 | 6/2010 | Jeck et al. | |
| 8,441,320 B2 | 5/2013 | Signoff et al. | |
| 8,811,928 B2 | 8/2014 | Lennartson et al. | |
| 8,892,063 B2 | 11/2014 | Jones et al. | |
| 9,077,405 B2 | 7/2015 | Jones et al. | |
| 9,178,493 B1 | 11/2015 | Nobbe | |
| 9,240,760 B2 | 1/2016 | Ishimoto et al. | |
| 9,277,501 B2 | 3/2016 | Lorenz et al. | |
| 9,535,110 B2 | 1/2017 | Nobbe | |
| 9,553,550 B2 | 1/2017 | Puliafico et al. | |
| 9,716,477 B2 | 7/2017 | Wagh et al. | |
| 9,748,905 B2 | 8/2017 | Scott et al. | |
| 9,864,000 B2 | 1/2018 | Nobbe et al. | |
| 10,038,409 B2 | 7/2018 | Nobbe | |
| 10,184,973 B2 | 1/2019 | Nobbe et al. | |
| 10,250,199 B2 * | 4/2019 | Klaren | H03F 1/223 |
| 10,305,433 B2 | 5/2019 | Ranta et al. | |
| 10,374,838 B2 | 8/2019 | Jiang et al. | |
| 10,439,562 B2 | 10/2019 | Tokuda et al. | |
| 10,439,563 B2 | 10/2019 | Takagi et al. | |
| 2002/0074499 A1 | 6/2002 | Butler | |
| 2003/0137355 A1 | 7/2003 | Lin | |
| 2005/0029453 A1 | 2/2005 | Allen et al. | |
| 2006/0098271 A1 | 5/2006 | Koller et al. | |
| 2006/0223457 A1 | 10/2006 | Rahman | |
| 2008/0300003 A1 | 12/2008 | Jeck et al. | |
| 2009/0258611 A1 | 10/2009 | Nakamura et al. | |
| 2011/0227642 A1 | 9/2011 | Hoyerby et al. | |
| 2011/0298538 A1 | 12/2011 | Andrys et al. | |
| 2013/0217341 A1 | 8/2013 | Jones et al. | |
| 2013/0229231 A1 | 9/2013 | Tanaka et al. | |
| 2014/0153461 A1 | 6/2014 | Lorenz et al. | |
| 2014/0266458 A1 | 9/2014 | Scott et al. | |
| 2015/0035612 A1 | 2/2015 | Maxim et al. | |
| 2015/0249479 A1 | 9/2015 | Nobbe | |
| 2018/0083578 A1 * | 3/2018 | Klaren | H03F 3/195 |
| 2018/0115287 A1 | 4/2018 | Rabjohn et al. | |
| 2018/0262164 A1 | 9/2018 | Ranta et al. | |
| 2019/0007240 A1 | 1/2019 | Jiang et al. | |
| 2019/0173433 A1 | 6/2019 | Ranta et al. | |
| 2019/0181907 A1 | 6/2019 | Pfann et al. | |
| 2020/0076391 A1 | 3/2020 | Ranta et al. | |

FOREIGN PATENT DOCUMENTS

| | | |
|---|---|---|
| WO | 2006107614 | 10/2006 |
| WO | 2012082445 | 6/2012 |

OTHER PUBLICATIONS

Nguyen, Hieu P., Office Action received from the USPTO dated Jan. 7, 2019 for U.S. Appl. No. 15/908,533, 27 pgs.

Nguyen, Hieu P., Notice of Allowance received from the USPTO dated Apr. 2, 2019 for U.S. Appl. No. 15/908,533, 16 pgs.

Nguyen, Hieu P., Office Action received from the USPTO dated Feb. 15, 2019 for U.S. Appl. No. 16/025,873, 18 pgs.

Mouanda, Thierry, Invitation to Restrict or to Pay Additional Fees received from the EPO dated Mar. 5, 2019 for appln. No. PCT/US2018/020332, 4 pgs.

Mouanda, Thierry, Written Opinion received from the EPO dated May 15, 2019 for appln. No. PCT/US2018/020332, 8 pgs.

Nguyen, Hieu P., Notice of Allowance received from the USPTO dated Jul. 11, 2019 for U.S. Appl. No. 16/025,873, 23 pgs.

Nguyen, Hieu P., Notice of Allowance received from the USPTO dated May 30, 2019 for U.S. Appl. No. 15/908,354, 29 pgs.

Nguyen, Hieu P., Notice of Allowance received from the USPTO dated Jun. 7, 2019 for U.S. Appl. No. 15/908,469, 14 pgs.

Nguyen, Hieu P., Office Action received from the USPTO dated Mar. 25, 2020 for U.S. Appl. No. 16/676,219, 22 pgs.

Curtis, Sean M., Applicant-Initiated Interview Summary received from the USPTO dated Apr. 20, 2020 for U.S. Appl. No. 16/206,828, 3 pgs.

Curtis, Sean M., Notice of Allowance received from the USPTO dated Apr. 30, 2020 for U.S. Appl. No. 16/206,828, 13 pgs.

Nguyen, Hieu P., Notice of Allowance received from the USPTO dated Aug. 14, 2020 for U.S. Appl. No. 16/676,219, 15 pgs.

* cited by examiner

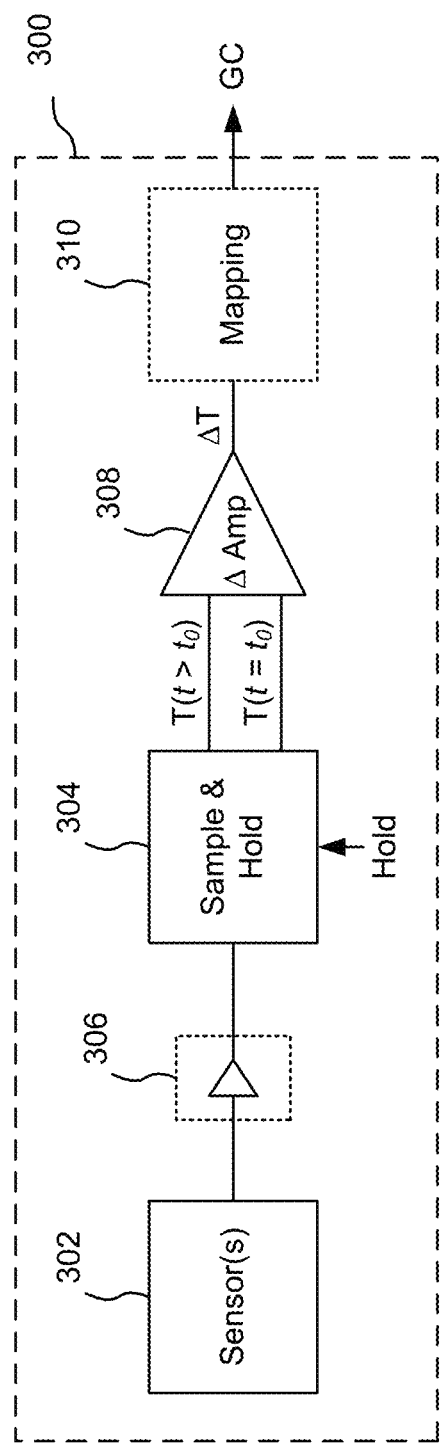
FIG. 3
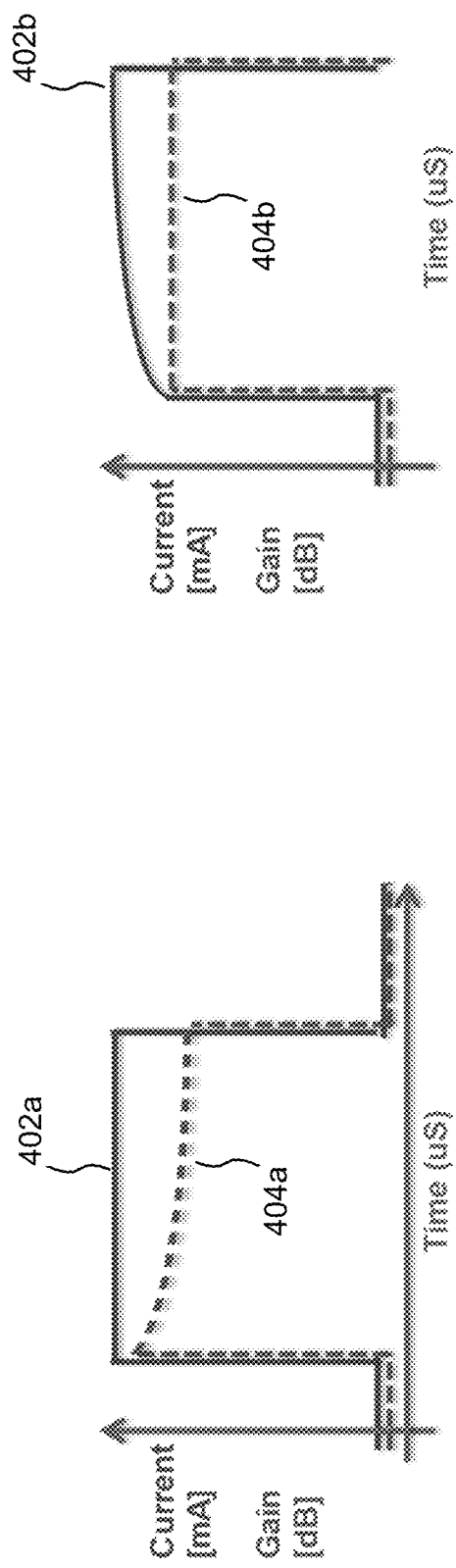
FIG. 4A (Prior Art)
FIG. 4B

POWER AMPLIFIER SELF-HEATING COMPENSATION CIRCUIT

CROSS-REFERENCE TO RELATED APPLICATIONS—CLAIM OF PRIORITY

The present application is a continuation of, and claims priority to, and commonly assigned U.S. patent application Ser. No. 15/908,533, filed Feb. 28, 2018, entitled "Power Amplifier Self-Heating Compensation Circuit", which is a continuation-in-part of, and claims priority to, commonly assigned U.S. patent application Ser. No. 15/445,811, filed Feb. 28, 2017, entitled "Power Amplifier Self-Heating Compensation Circuit" (now U.S. Pat. No. 10,056,874, issued Aug. 21, 2018), the entire contents of each of which are incorporated herein by reference.

The present application may be related to U.S. Pat. No. 9,178,493, issued Nov. 3, 2015, entitled "Mismatch Detection Using Replica Circuit", and to U.S. patent application Ser. No. 15/268,229, filed Sep. 16, 2016, entitled "Cascode Amplifier Bias Circuits", both of which are assigned to the assignee of the present invention, the entire contents of each of which are incorporated herein by reference.

BACKGROUND

(1) Technical Field

This invention relates to electronic circuitry, and more particularly to electronic power amplifier circuits.

(2) Background

Power amplifiers (PAs) are used in a multitude of electronic systems, particularly radio frequency (RF) systems, such as radios, cellular telephones, WiFi, etc. In a number of radio systems, communication of RF signals is based on time division duplexing (TDD), in which multiple radio transceivers utilize designated time slots within a frequency band to transmit or receive signals. When transmitting a signal in such systems, an RF transceiver PA is operated in a pulsed mode, amplifying an applied RF signal only during each designated time slot, and being powered OFF at other times.

FIG. 1 is a block diagram of a typical prior art radio transmitter two-stage power amplifier 100. In the illustrated example, an integrated circuit (IC) 102 includes several subcircuits that accept an RF input signal RFin and generate an amplified output signal RFout to a selected destination (e.g., one or more band filters and/or antenna ports); the IC 102 may also be referred to as a "chip" or "die".

In the illustrated example, an input impedance matching network (IMN) 104 impedance matches the input signal RFin to a first amplifier stage 106 (often called a driver). An interstage IMN 108 couples the output of the first amplifier stage 106 to a second amplifier stage 110 (in this case, a final stage). The amplified RF output of the second amplifier stage 110 is coupled to an output IMN 112, the output of which is RFout. The PA 100 example shown in FIG. 1 has two amplifier stages, but other embodiments may have fewer or more than two amplifier stages. One or more of the various IMN circuits 104, 108, 112 may be implemented in a tunable configuration, such as by using tunable inductors and/or tunable capacitors; some of the IMN circuits may be optional for some embodiments; and in some embodiments, one or more of the IMN circuits may be off-chip circuits.

In the illustrated example, the first amplifier stage 106 and the final amplifier stage 110 each have corresponding bias circuits 114, 116 for controlling the gain of their respective amplifier stages. A voltage supply $V_{DD}$ 118 provides power as needed to specific circuitry in the IC 102, and may be variable as a function of a control parameter to regulate the behavior of the PA 100. The voltage supply $V_{DD}$ may be provided from off-chip or may be generated on-chip from an external power source; an off-chip configuration is shown by way of example.

In operation in a TDD based radio system, such as WiFi system, a PA 100 will be powered ON in response to a supplied control signal (not shown) and amplify a transmission signal for a period of time, and then be powered OFF by the supplied control signal. FIG. 2 is a graph of an example ideal RFout pulse 200 from a TDD PA 100, and of an example realistic RFout pulse 202 from a TDD PA showing output power (Gain) as a function of time. As shown, the illustrated ideal pulse 200 ideally has a square wave-form over a 4 mS operational interval (such an interval corresponds to a "long packet" in a WiFi system). However, in actual pulsed PA circuits, self-heating of the PA generally causes Gain to "droop"—that is, as the PA circuit warms up due to current flow through the first and second amplifier stages 106, 110, Gain decreases over time. Self-heating of the PA 100 causes its Gain to droop by more than about 0.2 dB in 4 mS, as shown by the realistic pulse 202.

Some advanced RF systems have a specification that requires that Gain not droop more than a specified amount. For example, systems conforming to the WiFi 802.11ac standard may not exhibit more than 0.17 dB of PA Gain droop, and systems conforming to the WiFi 802.11ax standard may not exhibit more than 0.10 dB of PA Gain droop. The inability to maintain a flat enough Gain over time for pulses means that corresponding error vector magnitude (EVM) specifications cannot be met as well. Some attempts have been made to continuously monitor the ambient temperature of an IC and adjust the gain of a PA amplifier stage accordingly. However, by not responding only to self-heating during pulsed operation, such an approach causes too much bias current variation as ambient temperature varies, resulting in poor linearity performance due to under or over-biasing the PA across a full ambient temperature range.

Accordingly, there is a need for a circuit and method for controlling a power amplifier circuit to maintain approximately constant Gain versus time during pulsed operation sufficient to substantially offset self-heating of the power amplifier. The present invention meets this need.

SUMMARY OF THE INVENTION

The invention encompasses temperature compensation circuits that adjust one or more circuit parameters of a power amplifier (PA) to maintain approximately constant Gain versus time during pulsed operation sufficient to substantially offset self-heating of the PA. Some embodiments of the invention compensate for PA Gain "droop" due to self-heating using an analog and/or digital Sample and Hold (S&H) circuit. After a pulse commences within the PA, at least one S&H circuit samples and holds a temperature sensing element output signal corresponding to the temperature of the PA at a specified moment. Thereafter, each S&H circuit generates a continuous measurement that corresponds to the temperature of the PA during the remainder of the pulse. A "droop" Gain Control signal is then generated that is a function of the difference between the initial temperature and the subsequently measured operating temperature of the PA as the PA self-heats for the duration of the pulse.

One or more correction signals—in particular, Gain Control signals—may be applied to one or more adjustable or tunable circuits within a PA to offset the Gain droop of the PA. Examples of such circuits include the bias circuit for one or more PA amplifier stages, one or more impedance matching networks (e.g., input, interstage, and/or output IMNs), one or more auxiliary amplifier stages (e.g., variable gain amplifiers), one or more adjustable attenuation circuits on the input and/or output of the PA, and/or voltage or current supply circuits within or to the PA. Embodiments of the invention can maintain the effective temperatures of the operational components of a PA circuit within 2.5° C. from −40° C. to +85° C., and maintain RF Gain within about ±0.05 dB during at least a 4 mS operational pulse.

Other aspects of the invention include analog and digital examples of an S&H circuit that may be used in embodiments of the invention, continuous temperature compensation used in combination with compensation for PA self-heating compensation during pulsed operation, use of direct temperature sensing, use of indirect temperature measurement for generation of a Gain control signal to offset PA self-heating during pulsed operation, and placement of temperature sensing circuits on an integrated circuit.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 3 is a block diagram of a generalized circuit for generating a Gain Control (GC) signal suitable for adjusting one or more circuit parameters of a PA as a function of direct temperature measurement to maintain approximately constant Gain versus time during pulsed operation sufficient to substantially offset self-heating of the PA.

FIG. 4A is a graph of PA Bias Current and Gain versus time for an amplification pulse of a conventional PA.

FIG. 4B is a graph of PA Bias Current and Gain versus time for an amplification pulse of a PA in which the Bias Current is augmented and varied by a GC signal generated by the GC signal circuit of FIG. 3.

Like reference numbers and designations in the various drawings indicate like elements.

DETAILED DESCRIPTION OF THE INVENTION

Overview

Figure 1:
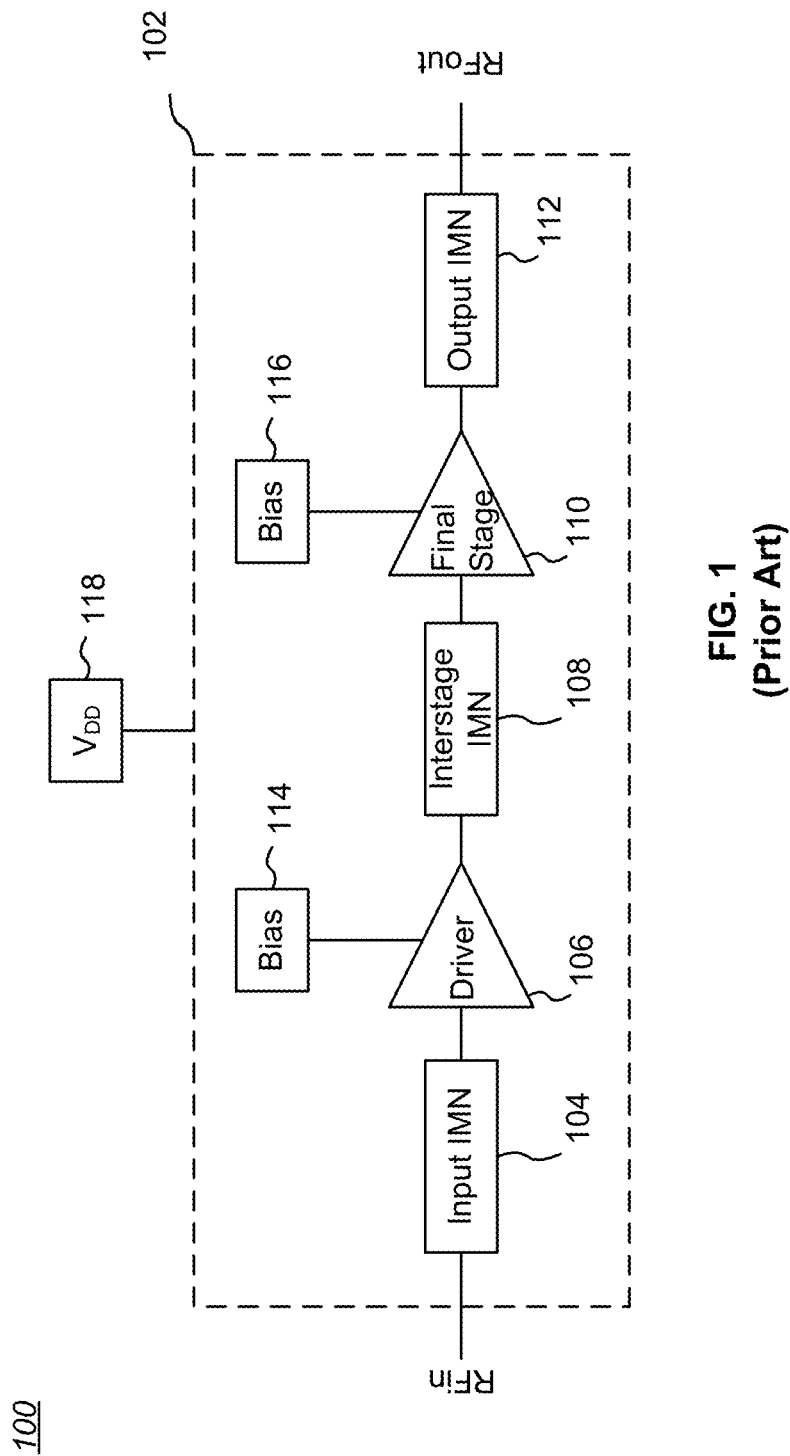
FIG. 1 is a block diagram of a typical prior art radio transmitter two-stage power amplifier.
Figure 2:
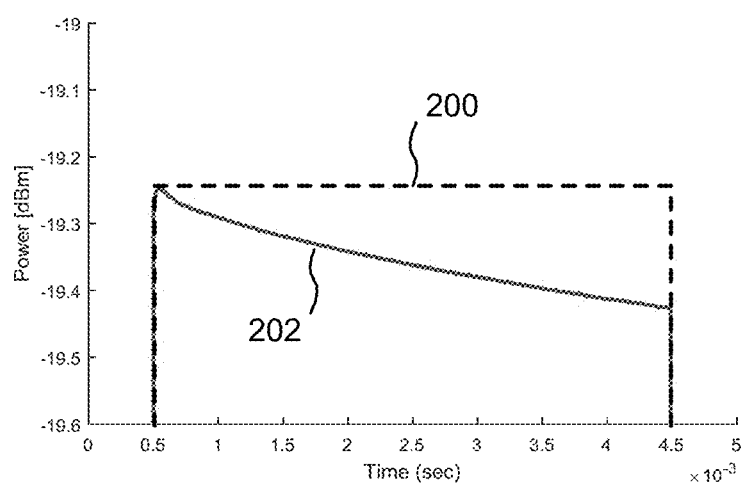
FIG. 2 is a graph of an example ideal RFout pulse from a TDD PA, and of an example realistic RFout pulse from a TDD PA, showing output power (Gain) as a function of time.

The invention encompasses temperature compensation circuits that adjust one or more circuit parameters of a power amplifier (PA) to maintain approximately constant Gain versus time during pulsed operation sufficient to substantially offset self-heating of the PA. Some embodiments of the invention compensate for PA Gain "droop" due to self-heating using an analog and/or digital Sample and Hold (S&H) circuit. After a pulse commences within the PA, at least one S&H circuit samples and holds a temperature sensing element output signal corresponding to the temperature of the PA at a specified moment. Thereafter, each S&H circuit generates a continuous measurement that corresponds to the temperature of the PA during the remainder of the pulse. A "droop" Gain Control signal is then generated that is a function of the difference between the initial temperature and the subsequently measured operating temperature of the PA as the PA self-heats for the duration of the pulse.

One or more correction signals—in particular, Gain Control signals—may be applied to one or more adjustable or tunable circuits within a PA to offset the Gain droop of the PA. Examples of such circuits include the bias circuit for one or more PA amplifier stages, one or more impedance matching networks (e.g., input, interstage, and/or output IMNs), one or more auxiliary amplifier stages (e.g., variable gain amplifiers), one or more adjustable attenuation circuits on the input and/or output of the PA, and/or voltage or current supply circuits within or to the PA. Embodiments of the invention can maintain the effective temperatures of the operational components of a PA circuit within 2.5° C. from −40° C. to +85° C., and maintain RF Gain within about ±0.05 dB during at least a 4 mS operational pulse.

Other aspects of the invention include analog and digital examples of an S&H circuit that may be used in embodiments of the invention, continuous temperature compensation used in combination with compensation for PA self-heating compensation during pulsed operation, use of direct temperature sensing, use of indirect temperature measurement for generation of a Gain control signal to offset PA self-heating during pulsed operation, and placement of temperature sensing circuits on an integrated circuit.

While aspects of the invention are described in the context of power amplifiers operated in a pulsed mode, the temperature compensation circuits encompassed by the invention are also generally applicable to target circuits having performance parameters affected by temperature and for which a flat response is desired, so long as such circuits have some adjustable parameter which allows compensating adjustment of the response.

Direct Temperature Measurement Gain Control Signal Generation

FIG. 3 is a block diagram of a generalized circuit 300 for generating a Gain Control (GC) signal suitable for adjusting one or more circuit parameters of a PA as a function of direct temperature measurement to maintain approximately constant Gain versus time during pulsed operation sufficient to substantially offset self-heating of the PA. The GC signal circuit 300 may be fabricated as part of an IC that includes a PA, but in some applications one or more components of the GC signal circuit 300 may be external to such an IC. In many applications, it may be desirable to have one GC signal circuit 300 per PA amplifier stage.

One or more temperature sensors 302 capable of measuring the temperature of a PA or of a circuit that closely follows the temperature of a PA (e.g., a small-scale replica of a PA) are coupled to a sample-and-hold (S&H) circuit 304, optionally through an amplifier or buffer 306. Each temperature sensor 302 may include, for example, a PN junction diode, a diode-connected field effect transistor (FET), a resistor, a proportional-to-absolute temperature (PTAT) circuit, a digital temperature sensor, etc. In many applications, it is desirable for the temperature sensors 302 to have a fast response time to changes in temperature (i.e., high thermal diffusivity).

An important characteristic of the S&H circuit 304 is that it be able to capture (sample and hold) a signal from the temperature sensors 302 representing the temperature T of an associated PA at an initial time point $t=t_0$ and provide that held (fixed) signal, $T(t=t_0)$, as a first output. Thereafter, the S&H circuit 304 generates a continuous measurement that corresponds to the temperature T of the PA during the remainder of the pulse (i.e., for times $t>t_0$) and provides that variable signal, $T(t>t_0)$, as a second output. The initial time point to is controlled by a Hold control signal normally set to be applied to the S&H circuit 304 shortly after (e.g., 5-10 µS) the commencement of an operational pulse within the PA. Delayed capture of $T(t=t_0)$ allows the PA to reach its peak gain and/or a desired initial operating condition after pulse commencement.

The two outputs of the S&H circuit 304, $T(t=t_0)$ and $T(t>t_0)$, are coupled to respective inputs of a differential amplifier 308. The differential amplifier 308 may be, for example, a differential transconductance amplifier that turns a voltage difference between two input terminals into a current at an output terminal. However, other circuits may be used that can generate an output that is a function of the difference between two provided inputs.

The differential amplifier 308 generates an output signal ΔT that represents the difference between the initial temperature $T(t=t_0)$ and the subsequently measured PA operating temperature $T(t>t_0)$ as the PA self-heats for the duration of the pulse. The output signal ΔT from the differential amplifier 308 may be applied to a correction circuit, such as an optional mapping circuit 310 that maps or associates ΔT signal values to control signal values (e.g., voltage or current levels) to output a Gain Control (GC) signal that is a function of the difference between the initial temperature and the subsequently measured PA operating temperature as the PA self-heats for the duration of the pulse.

In some applications, the ΔT output signal of the differential amplifier 308 may be essentially used directly as the GC signal (e.g., where the "mapping" of the ΔT output signal to GC signal is linear and properly proportionate). In other applications, the "mapping" of the ΔT output signal to GC signal may apply an offset linear function, an inverse function, or a non-linear function (e.g., a logarithmic function). In any case, the mapping function may be programmable. Programming such a mapping function for an IC embodying GC signal circuit 300 may be performed once, such as during fabrication or in the field (e.g., by burning or "blowing" fusible links). Alternatively, such programming may vary as a function of programmed input to the IC from an external source, and/or as a function of IC state or status. In some embodiments, the ΔT output signal of the differential amplifier 308 may be digitized (e.g., through an analog-to-digital converter, or ADC) and applied to a look-up table (LUT) programmed with a desired mapping function in order to generate a GC signal; the GC signal output from the LUT may be used directly for digitally adjustable components, or converted back into a voltage or current signal for application to analog circuitry.

Because the GC signal circuit 300 measures an initial temperature $T(t=t_0)$ of a PA and compares that temperature to subsequently measured values of PA operating temperature $T(t>t_0)$, the GC signal is a function of PA self-heating during pulsed operation, regardless of other contributors to temperature inside and/or outside of an IC.

Application of GC Signal

The output GC signal generated by the GC signal circuit 300 may be used to offset the Gain droop of a PA as the PA self-heats for the duration of a pulse. A variety of circuit parameters can be adjusted to achieve such an offset. For example, FIG. 4A is a graph of PA Bias Current 402a and Gain 404a versus time for an amplification pulse of a conventional PA. While the PA Bias Current 402a rises quickly and is then essentially flat for the pulse duration, the corresponding PA Gain 404a exhibits droop over time due to self-heating of the PA.

In contrast, FIG. 4B is a graph of PA Bias Current 402b and Gain 404b versus time for an amplification pulse of a PA in which the Bias Current 402b is augmented and varied by a GC signal generated by the GC signal circuit 300 of FIG.

3. For example, the GC signal may be a current summed with the normal Bias Current applied to a PA. In the illustrated example, PA Bias Current 402b rises quickly and is then adjusted even higher by the GC signal as a function of PA self-heating temperature rise during the pulse duration. The increased Bias Current 402b to the PA increases the Gain of the PA. Accordingly, the droop in Gain of the PA that would otherwise occur due to self-heating is substantially offset by a nearly mirror-image of the drooping Gain curve 404a of FIG. 4A, leading to an essentially flat PA Gain 404b for the duration of the pulse.

Figure 5:
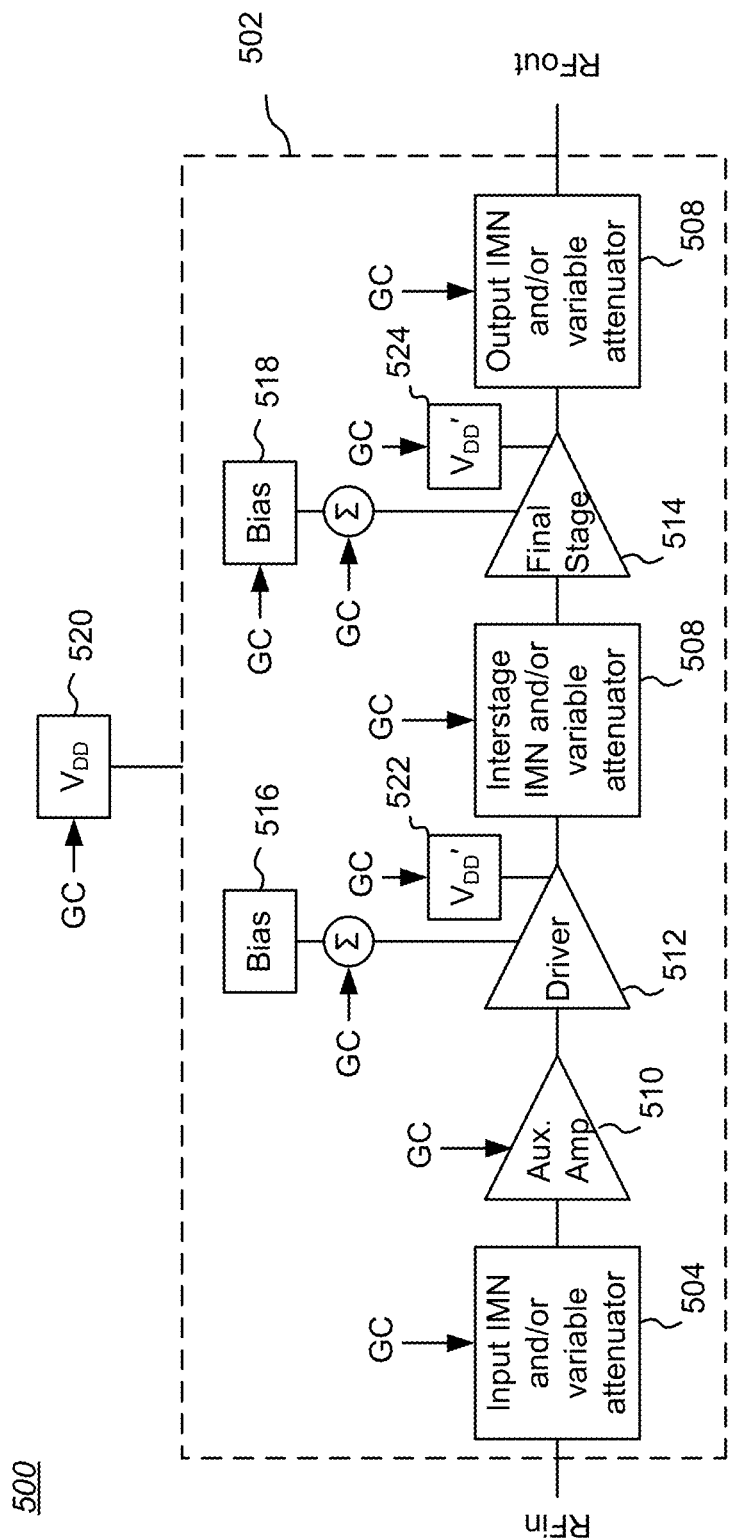
FIG. 5 is a block diagram of a PA on an integrated circuit having multiple components whose parameters may be adjusted to offset self-heating Gain droop of the PA under control of the GA signal from the circuit of FIG. 3.

More generally, the output GC signal generated by the GC signal circuit 300 may be used to offset the self-heating Gain droop of a PA by varying any PA circuit parameter or set of parameters that controls the effective Gain of the PA output at RFout so as to essentially flatten the effective Gain. Such circuit parameters include output power, voltage, current, and/or RF signal amplitude. For example, FIG. 5 is a block diagram of a PA 500 on an integrated circuit 502 having multiple components whose parameters may be adjusted to offset self-heating Gain droop of the PA under control of the GA signal from the circuit of FIG. 3.

In the illustrated example, an input IMN and/or variable attenuator circuit 504 may be controlled by a coupled GC signal so as to vary the matching characteristics of the circuit and/or the RF signal path attenuation level in order to offset the PA Gain droop. For example, a digital step attenuator (DSA) or variable analog attenuator may be configured to always provide a nominal level of signal amplitude attenuation, which may be adjusted downward by the GC signal (converted if necessary to digital form through an ADC) to reduce RF signal attenuation from RFin to RFout, thus compensating for PA Gain droop by increasing the amplitude of the RF signal. A similar approach may be used for an intermediate IMN and/or variable attenuator circuit 506, and/or for an output IMN and/or variable attenuator circuit 508.

As another example, an auxiliary amplifier 510, such as a variable gain amplifier (VGA), may be placed in the RF signal path between RFin and RFout to provide additional signal amplification (Gain) in response to the GC signal, thus compensating for PA Gain droop.

Looking at the first amplifier (driver) stage 512 and the second amplifier (final) stage 514 of the example PA 500, a GC signal may be combined with the output of their respective bias circuits 516, 518 to boost the bias level of one or both amplifier stages (that is, in some applications, only one amplifier stage 512, 514 need be compensated in order to offset the self-heating PA droop of all amplifier stages). For example, an analog current representing the GC signal may be summed with the normal bias current applied to one or both amplifier stages. Alternatively, a GC signal may be applied to the respective bias circuits 516, 518 to internally adjust the bias level supplied to one or both amplifier stages. Further details regarding biasing of a PA are disclosed in U.S. patent application Ser. No. 14/272,415, filed May 7, 2014, entitled "Mismatch Detection Using Replica Circuit", and in U.S. patent application Ser. No. 15/268,229, filed Sep. 16, 2016, entitled "Cascode Amplifier Bias Circuits", both of which are assigned to the assignee of the present invention, and the contents of which are hereby incorporated by reference.

As another example, the voltage supply $V_{DD}$ 520 to the IC 502 may be varied (e.g., boosted) as a function of the GC signal to compensate for self-heating PA droop. Alternatively, the voltage (and/or current) supplied only to specific components of the PA may be varied as a function of the GC signal to compensate for self-heating PA droop. For example, drain voltage sources $V_{DD}$' 522, 524 may be derived from $V_{DD}$ 520 and applied to the "top" of a corresponding stack of N FETs comprising each amplifier stage 512, 514 (N is typically between 3 and 5). The drain voltage sources $V_{DD}$' 522, 524 may be varied by the GC signal to adjust the effective Gain of the stage. As one example, the drain voltages sources $V_{DD}$' 522, 524 may be derived from $V_{DD}$ 520 by placing a low drop-out (LDO) voltage regulator between $V_{DD}$ and the drain of a stack of FETs comprising a PA stage. Increasing the output voltage of the LDO would increase the Gain of the FET stack. Accordingly, to compensate for Gain droop, the LDO output voltage could initially be set to a relatively low value, and then increased to maintain an essentially constant Gain.

Another alternative is to adjust the gate bias voltages to one or more of the N FETs in an amplifier stage stack to change the drain voltage on the "bottom" FET in the stack, thereby adjusting its gain. This approach does not require any additional power supply, but merely redistributes the available $V_{DD}$ across the FETs in the stack to achieve a desired gain adjustment.

As noted above, in many applications, it may be desirable to have one GC signal circuit 300 per PA amplifier stage. However, as should be clear from the above disclosure, the GC signal from one GC signal circuit 300 may be used to adjust the effective Gain of the PA as a whole during an operational pulse by adjusting only one or a subset of the PA components. Accordingly, it is not necessary that the GC signal from a GC signal circuit 300 associated with a PA amplifier stage be used to adjust only parameters of the associated stage to offset self-heating PA droop. For example, if separate GC signal circuits are associated with a PA driver stage and a PA final stage, and the resulting GC signals are used to control the bias applied to at least one stage, then at least the following configurations are possible:

| Stage for which ΔT is measured to generate GC signal | Stage for which bias is adjusted in response to generated GC signal |
|---|---|
| Driver | Driver |
| Final | Final |
| Final | Driver |
| Driver | Final |
| Final | Driver & Final |
| Driver | Driver & Final |

Example Analog Sample and Hold Circuit

Figure 6A:
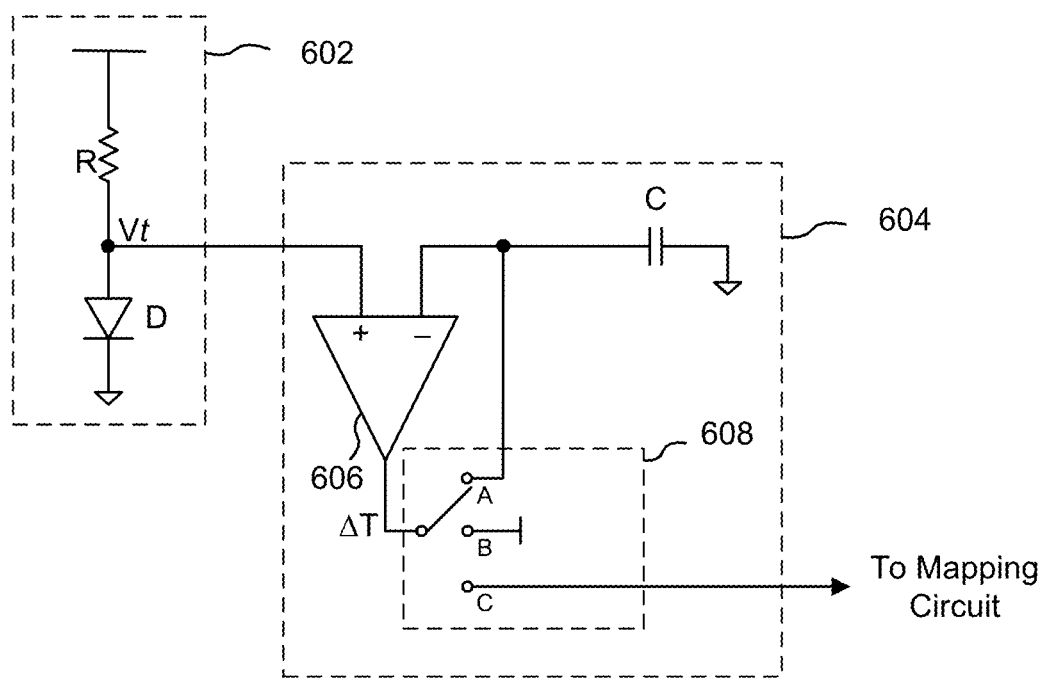
FIG. 6A is a schematic diagram of one embodiment of an analog temperature sensor and S&H circuit that may be used in the circuit of FIG. 3.

FIG. 6A is a schematic diagram of one embodiment of an analog temperature sensor 602 and S&H circuit 604 that may be used in the circuit of FIG. 3. The temperature sensor 602 includes a series-coupled resistor R and diode D coupled between a voltage supply and circuit ground. If the diode D is fabricated in reasonably close proximity to an amplifier stage of a PA, the node between the resistor R and diode D will have a voltage Vt that varies as a function of the temperature of the amplifier stage (see further disclosure below regarding placement of temperature sensor circuits). As should be clear, a different temperature sensing circuit could be used in place of the diode-based temperature sensor 602; examples are given above.

The voltage Vt is coupled to a first input of a differential amplifier 606 which may be, for example, a differential transconductance amplifier (however, as noted above, other circuits may be used that can generate an output that is a function of the difference between two provided inputs). The output of the differential amplifier 606 is coupled to a 3-terminal switch 608 that may be implemented with field effect transistors (FETs). Terminal A of the switch 608 is coupled to a charge storage capacitor C and to a second input of the differential amplifier 606. Terminal B is an open circuit, and terminal C is coupled to a mapping circuit as in FIG. 3, or is directly used as a GC signal.

Figure 6B:
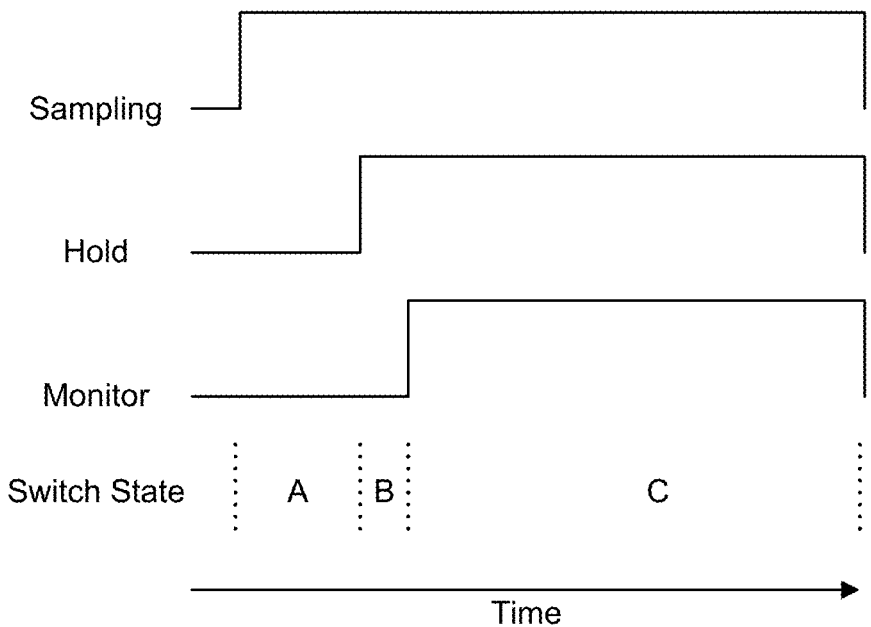
FIG. 6B is a timing diagram showing one example of the control signals for the A, B, and C terminals of the switch of FIG. 6A.

The state of the switch 608 is set by control signals essentially derived from the supplied control signal, PA_en, that powers the PA ON and OFF, defining a pulse. FIG. 6B is a timing diagram showing one example of the control signals for the A, B, and C terminals of the switch 608 of FIG. 6A.

When the PA is powered ON (enabled) by its control signal PA_en (not shown), the temperature sensor 602 and S&H circuit 604 are also powered ON; alternatively, the temperature sensor 602 and S&H circuit 604 may always be ON, but be initialized at the rising edge of PA_EN signal. In either case, concurrently with the assertion of an "enabled" state by the control signal PA_en (or after a desired delay), a Sampling signal is generated and applied to the switch 608 to couple the output of the differential amplifier 606 to terminal A as an initial state. As a consequence, capacitor C will be charged up until both inputs to the differential amplifier 606 are equal to Vt, the voltage representing the momentary temperature of an associated amplifier stage of a PA. More precisely, for the case where the differential amplifier 606 is a transconductance amplifier, the voltage on the positive input will be Vt, but the voltage on the negative input (and on capacitor C) will be the combination of Vt and the inverse of the cumulative offsets (imbalances) in the differential amplifier 606 required to set its output current to zero (once the voltage on capacitor C settles to a static value, no current can flow). Accordingly, the S&H circuit 604 in effect calibrates out all of its offsets during the Sampling phase, and capacitor C is in essence constantly tracking the temperature of the associated PA.

After a short delay (e.g., about 5-10 μS), a Hold signal is generated and applied to the switch 608 to couple the output of the differential amplifier 606 to terminal B and thus uncouple the capacitor C from any further input from the differential amplifier 606; the transition to terminal B provides a non-overlapping switching sequence to reduce sampling errors. The Hold signal may be a delayed version of the Sampling signal (the circuits for delaying timing signals are conventional and thus not shown). At the moment of assertion of the Hold signal, $t_0$, the capacitor C has a charge that represents the temperature $T(t=t_0)$ of the associated PA amplifier stage (as well as any associated S&H circuit 604 offsets, so as to effectively dynamically calibrate out such offsets as noted above). Thus, coupling the output of the differential amplifier 606 to terminal B for a brief (e.g., 0.1-1 μS) transition period allows the circuitry to settle to a new state—thus avoiding transients in the GC signal circuitry—while preserving the sampled charge on capacitor C. For example, the compensation circuit that includes the S&H circuit 604 may generate a gain step when it transitions to the Hold phase, so this should occur before an RF receiver begins to lock in its gain equalization.

Thereafter, a Monitor signal is generated and applied to the switch 608 to couple the output of the differential amplifier 606 to terminal C. The Monitor signal may be a delayed version of the Sampling signal or of the Hold signal. When the S&H circuit 604 is in this configuration, one input of the differential amplifier 606 is the stored charge (voltage) on capacitor C, representing $T(t=t_0)$, while the other input of the differential amplifier 606 is Vt, representing $T(t>t_0)$—that is, the continuously measured temperature of the PA during a pulse. The output of the differential amplifier 606 is ΔT, which represents the difference between the initial temperature $T(t=t_0)$ and the subsequently measured PA operating temperature $T(t>t_0)$ as the PA self-heats for the duration of a pulse.

As should be clear, other analog sample and hold circuits may be used to determine $\Delta T=T(t>t_0)-T(t=t_0)$ during the occurrence of PA pulsed operation.

Example Digital Sample and Hold Circuit

Figure 7:
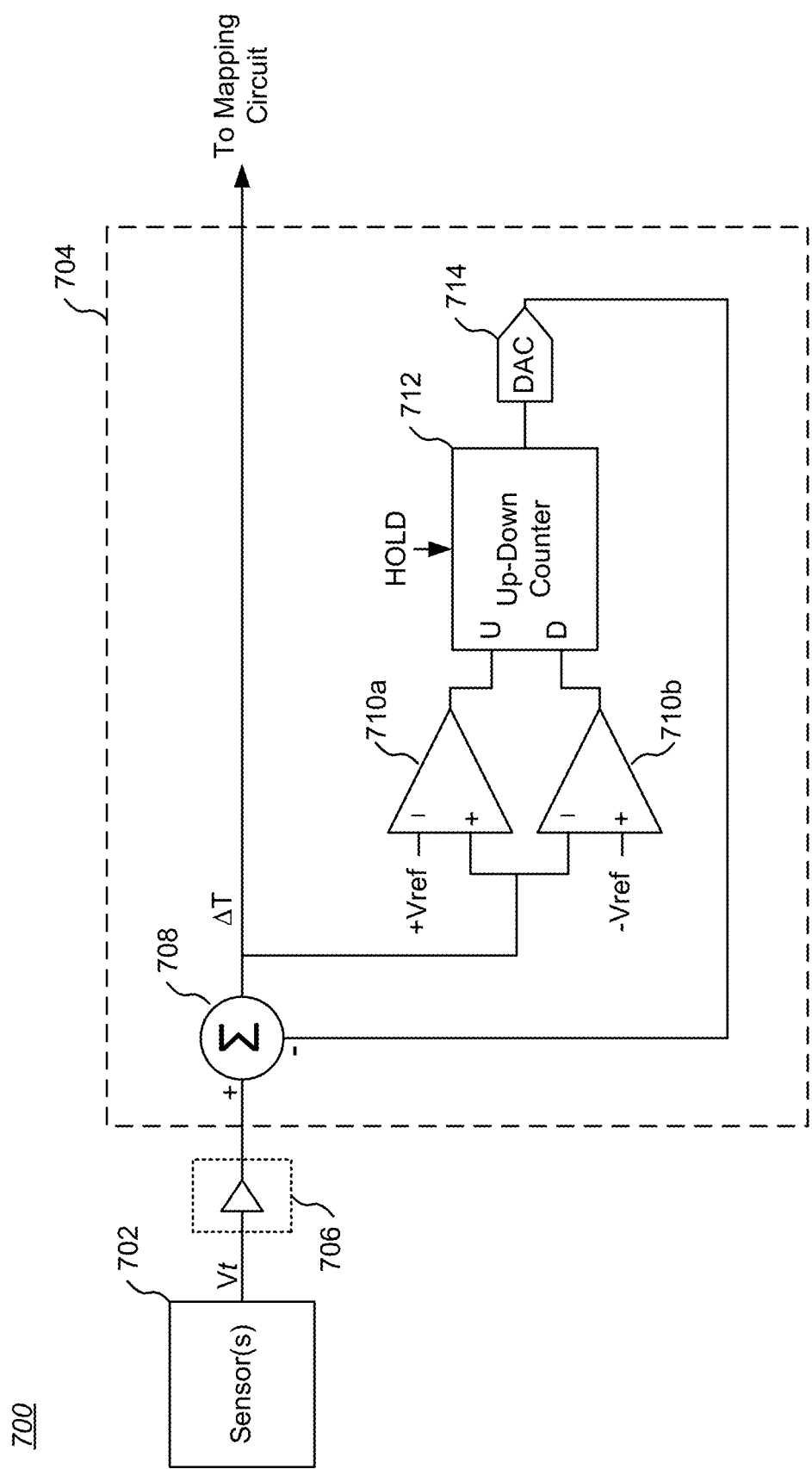
FIG. 7 is a block diagram of one embodiment of a partially digital S&H circuit.

FIG. 7 is a block diagram of one embodiment of a partially digital S&H circuit 700. The output Vt of one or more temperature sensors 702 is coupled to the input of a counter-DAC-based circuit 704, optionally through an amplifier or buffer 706. More specifically, the temperature sensors 702 are coupled to the plus-input of a summing circuit 708 in this example. The output of the summing circuit 708 is coupled to an optional mapping circuit or may be used directly as a GC signal.

The output of the summing circuit 708 is also coupled to opposite polarity inputs of two comparators 710a, 710b. The other inputs of the comparators 710a, 710b are coupled to a associated reference voltages +Vref and −Vref. In the illustrated example, a positive reference voltage+Vref (e.g., +0.5 LSB) is applied to the negative input of comparator 710a, and a negative reference voltage −Vref (e.g., −0.5 LSB) is applied to the positive input of 710b. The outputs of the comparators 710a, 710b are coupled to respective Up and Down inputs of an Up-Down counter 712. The count output of the Up-Down counter 712 is coupled to a DAC 714, the analog output of which is coupled to the minus-input of the summing circuit 708. A HOLD signal controls enablement of the Up-Down counter 712, and may be a delayed version of the PA_en control signal for an associated PA.

In operation, the differential voltage sum from the summing circuit 708 (i.e., plus-voltage less minus-voltage) is applied to the comparators 710a, 710b. While the Up-Down counter 712 is enabled (e.g., the HOLD signal=0), if the sum is greater than +Vref, the Up-Down counter 712 counts UP; conversely, if the sum is less than −Vref, the Up-Down counter 712 counts DOWN. The digital output of the Up-Down counter 712 is converted back to an analog signal by the DAC 714.

When the output of the DAC 714 equals Vt (within a margin of error of ±0.5 LSB) at a moment in time, the output of the Up-Down counter 712 does not change state. If Vt decreases (indicating an increase in temperature of the associated PA when using a sensor having a negative temperature coefficient, such as the diode-based sensor as in FIG. 6A), then the Up-Down counter 712 will count DOWN until the output of the DAC 714 again equals the Vt (within the margin of error). Conversely, if Vt increases (indicating a decrease in temperature of the associated PA when using a sensor having a negative temperature coefficient), then the Up-Down counter 712 will count UP until the output of the DAC 714 again equals the Vt (again, within the margin of error). Accordingly, the output of the DAC 714 represents the continuously tracked temperature of the associated PA while the Up-Down counter 712 is enabled. As should be clear, other temperature sensors may have a positive temperature coefficient (i.e., Vt would increase with increasing temperature and decrease with decreasing temperature); the mapping circuit may be used to account for a sign or function change in the S&H circuit 700.

When the HOLD signal is asserted (e.g., HOLD=1) at time to, thereby disabling counting in the Up-Down counter 712, the output of the Up-Down counter 712 cannot change. Accordingly, the last count output represents a held value for Vt, which represents $T(t=t_0)$. Since the minus-input to the summing circuit 708 is thereafter constant for the duration of a pulse, and the plus-input to the summing circuit 708 tracks the value of Vt, which represents $T(t>t_0)$, the output of the summing circuit 708 is $\Delta T$. As noted above, $\Delta T$ represents the difference between the initial temperature $T(t=t_0)$ and the subsequently measured PA operating temperature $T(t>t_0)$ as the PA self-heats for the duration of a pulse. The $\Delta T$ value may be used directly as a GC signal or mapped to generate a GC signal as described above.

As should be clear, other digital or partly digital sample and hold circuits may be used to determine $\Delta T=T(t>t_0)-T(t=t_0)$ during the occurrence of PA pulsed operation.

Temperature Difference Measured at Proximate & Distant Locations

In some applications, two or more continuous temperature sensing circuits can be used to isolate measurements of PA self-heating during pulsed operation without using a sample and hold configuration. A first continuous temperature sensing circuit may be located in close proximity to a PA, while a second continuous temperature sensing circuit may be located at a farther distance from the heat-generating components on an IC, particularly the PA amplifier stages, so as to measure general IC temperature while minimizing the influence of heat generated by other circuits on the IC. Examples of such placements are discussed below with respect to FIG. 11.

Instead of holding an initial temperature reading in an S&H circuit, the measurements from the distant continuous temperature sensing circuit would be subtracted from the measurements from the proximate continuous temperature sensing circuit during pulsed operation of the PA associated with the proximate continuous temperature sensing circuit. The resulting difference may be applied to a mapping circuit to generate a Continuous GC signal that reflects essentially only PA self-heating during pulsed operation.

In essence, rather than defining a $\Delta T$ as being the difference between a temperature at an initial time and a temperature at a subsequent time, $\Delta T$ can instead be defined as the difference between a proximate temperature $T(p)$ indicative of self-heating during pulsed operation of a PA, and a distant temperature $T(d)$ reflecting general IC temperature; that is, $\Delta T=T(p)-T(d)$. As should be clear, a variety of circuits may be used to determine $\Delta T$ in this fashion during the occurrence of PA pulsed operation. The resulting difference, $\Delta T$, may then be mapped to a GC signal and the GC signal applied to offset the self-heating of the PA, as described above.

Figure 8:
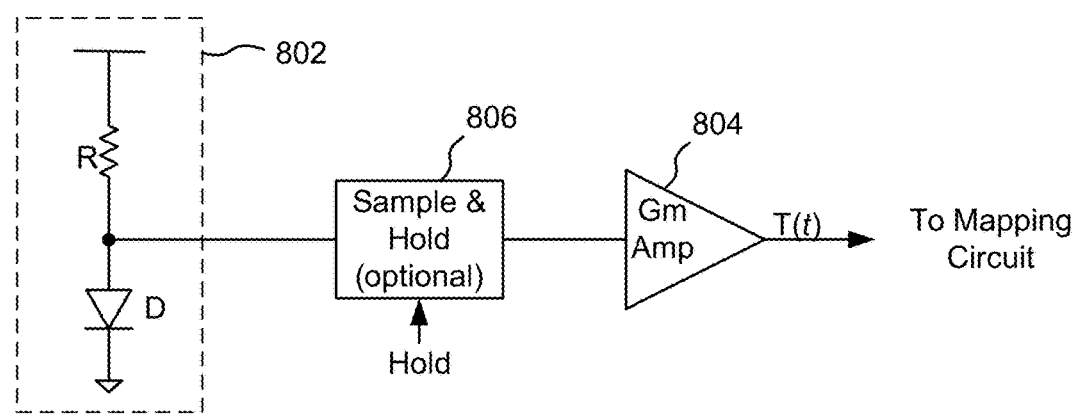
FIG. 8 is a schematic diagram of one embodiment of a continuous temperature compensation circuit.

Suitable continuous temperature sensing circuits may be readily implemented on an IC. For example, FIG. 8 is a schematic diagram of one embodiment of a continuous temperature compensation circuit 800. A temperature sensor 802 includes a series-coupled resistor R and diode D coupled between a voltage supply and circuit ground. The node between the resistor R and diode D will have a voltage Vt that varies as a function of the surrounding temperature. The voltage Vt may be amplified by a transconductance amplifier 804 that turns the voltage applied to its input terminal into a current at its output terminal. The output of the amplifier 804 represents a continuous measurement of temperature over time, T(t), at the location of the temperature sensor 802. As should be clear, other circuits may be used to determine T(t).

In a variation, the continuous temperature sensing circuit 800 used for distant temperature measurements may include an optional S&H circuit 806 so that the measured ambient temperature at the beginning of pulse may be sampled and held near the commencement of pulsed operation, thus "locking" the ambient temperature measurement to an invariant value for the duration of the pulse. The S&H circuit 806 would be controlled by a Hold signal generated by commencement of a pulse (possibly with some delay). Such a configuration would prevent PA self-heating during pulsed operation from influencing the distant temperature sensor.

Continuous Temperature Compensation

Any of the circuits for generating a GC signal described above (or their equivalents) can be used in conjunction with continuous temperature compensation of bias current to one or more stages of a PA. As is known, it is often useful to adjust the Gain of a PA to compensate for ambient temperature, such as the environment in which an IC is used (e.g., embedded within a cellular phone enclosure located in a desert).

For example, a continuous temperature sensing circuit 800 such as shown in FIG. 8 may be located at an appreciable distance from heat-generating components on an IC, particularly the PA amplifier stages, to minimize the influence of heat generated by other circuits on the IC. The output of such a continuous temperature sensing circuit 800 may be applied to a mapping circuit to generate an Ambient GC signal. Whereas the GC signal and Continuous GC signal described above are correlated with the self-heating of an associated PA, an Ambient GC signal is designed to be uncorrelated with such self-heating. In some embodiments, an Ambient GC signal may be summed with the normal Bias Current applied to a PA to compensate for variations in Gain due to changes in ambient temperature. In addition, a GC signal or Continuous GC signal may be summed with the normal Bias Current applied to a PA to compensate for variations in Gain due to PA self-heating during pulsed operation.

Indirect Temperature Measurement

In the embodiments described above, PA self-heating during pulsed operation was directly measured by one or more temperature sensor circuits. In alternative embodiments, PA self-heating during pulsed operation may be inferred (i.e., indirectly measured). For example, instead of measuring PA temperature rise due to self-heating and using the result to adjust Gain, measurement can be made of another circuit parameter of the PA or of a scaled replica of the PA that varies as a function of self-heating of the PA during pulsed operation. The resulting measurement can be used to adjust the effective Gain of the PA, such as by adding an off-setting current to the bias current for one or more amplifier stages of the PA.

Figure 9:
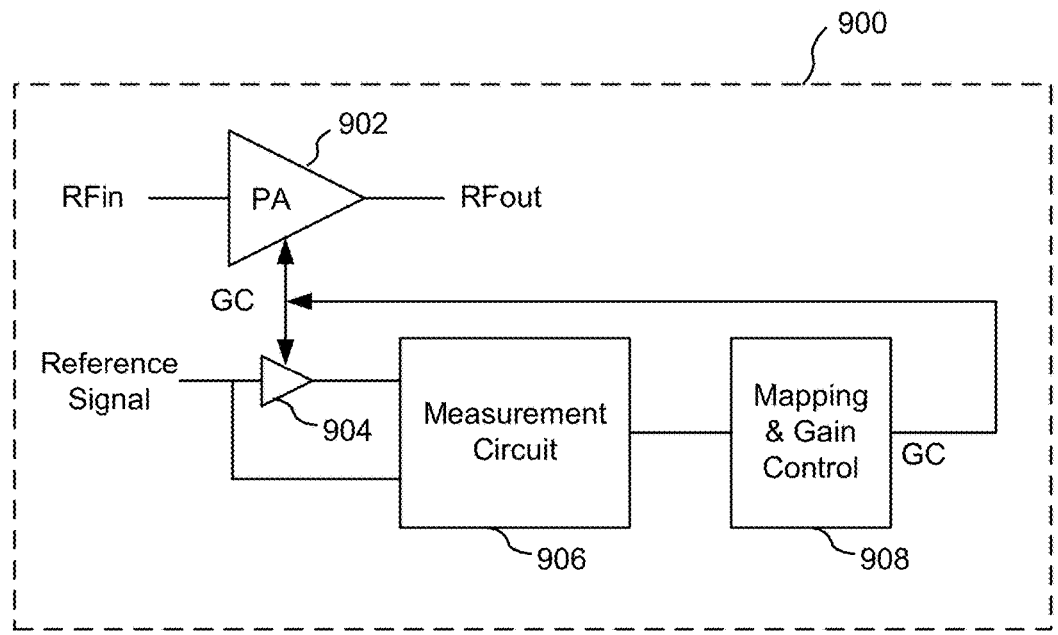
FIG. 9 is a first embodiment of an indirect temperature measurement gain control signal generation circuit.

FIG. 9 is a first embodiment of an indirect temperature measurement gain control signal generation circuit 900. The circuit 900 includes a conventional PA 902 having a Gain control adjustment (e.g., an adjustable bias circuit). Also included is a scaled replica amplifier 904 that, in known fashion, mimics the characteristics and performance behavior of the PA 902, but at a smaller scale (e.g., ⅛ size). The replica amplifier 904 would be fabricated in close proximity to the PA 902 so as to be affected by the self-heating of the PA 902 during pulsed operation. The nominal Gain for the replica amplifier 904 generally would be the same as the nominal Gain for the PA 902 to maximize correlation, but may be set to some other value, such as unity, to simply measurement.

In the illustrated example, a Reference Signal is applied to the input of the replica amplifier 904 and to a first input of a conventional measurement circuit 906, which may, for example, measure a desired parameter, such as Gain, power, voltage, current, etc. When using a replica amplifier 904, the Reference Signal typically would be an RF or AC signal (e.g., 0.5V ±10 mV) simply intended to measure the small-signal response of the replica amplifier 904. The output of the replica amplifier 904 is coupled to a second input of the measurement circuit 906, which outputs a signal that represents the difference (e.g., in Gain, power, voltage, current, etc.) between the Reference Signal and the output of the replica amplifier 904.

Since the replica amplifier 904 mimics the behavior of the PA 902 and is located in close proximity to the PA 902, self-heating of the PA 902 during pulsed operation will cause a correlated temperature change in the replica amplifier 904. The change in temperature of the replica amplifier 904 during a pulse will cause the Gain of the replica amplifier 904 to droop. The measurement circuit 906 will output a signal proportional to the amount of droop in comparison to the Reference Signal, which thus represents an indirect, temperature-dependent measurement of the droop occurring in the PA 902 during the pulse. The measurement circuit 906 output may be coupled to a mapping and Gain control circuit 908 that provides a suitable GC signal back to the PA 902 and the replica amplifier 904 to boost their respective Gains in an amount sufficient to substantially offset the droop.

Since the measured parameter of the replica amplifier circuit 904 (e.g., change in Gain) is measured only during pulsed operation of the PA 902 and directly takes into account a characteristic that is a function of self-heating of the PA 902 during pulsed operation, no sample and hold circuitry is required. Alternatively, a S&H circuit (not shown) may be provided (e.g., within or after the measurement circuit 906) to capture a DC representation of the measured parameter of the replica amplifier circuit 904 at $t_0$ and compare that held value to the instantaneous parameter value of the replica amplifier circuit 904 during pulsed-operation of the PA 902 to determine the amount of Gain droop of the amplifier circuit 904 (and hence of the PA 902, due to its self-heating during pulsed operation). The difference between the two measured values would be applied to the mapping and Gain control circuit 908 to generate a suitable GC signal back to the PA 902 and the replica amplifier 904 to boost their respective Gains in an amount sufficient to substantially offset the droop. The sample-and-hold configuration can be used continuously or as a sampled system. The benefit of using a sampled version is that the adjustment range is minimized (e.g., $\Delta 10°$ C. instead of, for example, $-40°$ C. to $+85°$ C., which is a difference of 125° C.).

Further details regarding the use of replica circuits in conjunction with a PA are disclosed in U.S. patent application Ser. No. 14/272,415, filed May 7, 2014, entitled "Mismatch Detection Using Replica Circuit", incorporated by reference above.

Note that a similar approach may be utilized in which the power measurement circuit 906 is coupled to the input and output of the PA 902 itself (i.e., the replica amplifier 904 is not used).

Figure 10:
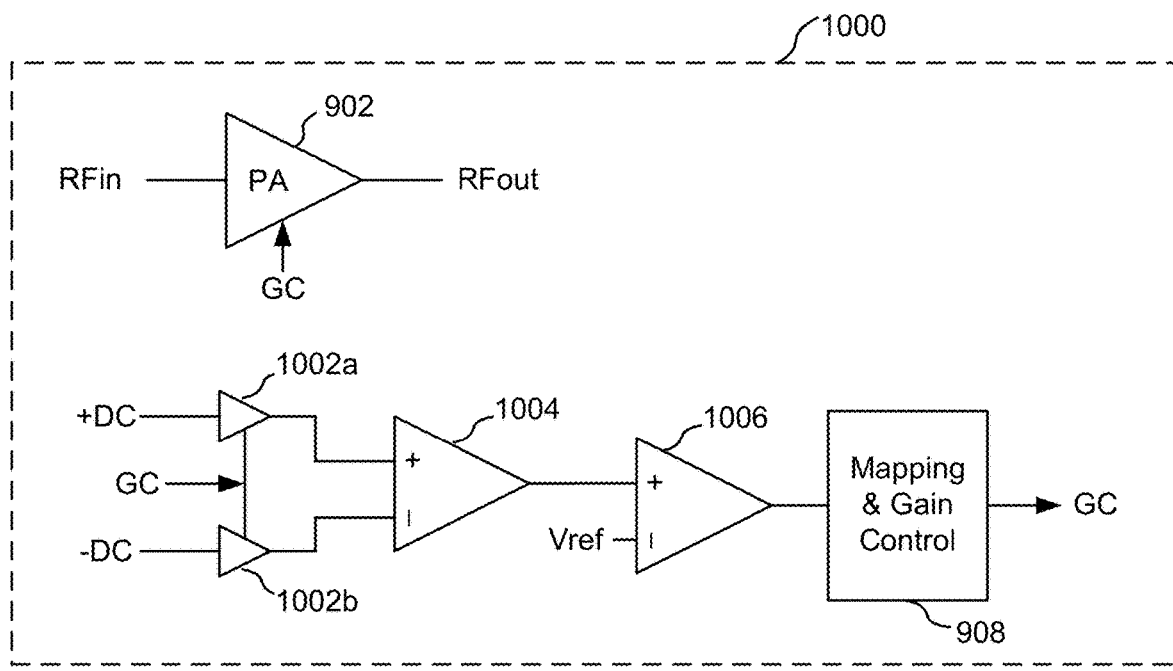
FIG. 10 is a second embodiment of an indirect temperature measurement gain control signal generation circuit.

FIG. 10 is a second embodiment of an indirect temperature measurement gain control signal generation circuit 1000. In this embodiment, instead of using an AC signal as reference signal as shown in FIG. 9, plus and minus DC voltages (e.g., 0.5V+10 mV=0.51V, and 0.5V−10 mV=0.49V) may be applied to a pair of scaled replica amplifiers 1002a, 1002b located in close proximity to a PA 902. The output of the replica amplifiers 1002a, 1002b may be applied to a first differential amplifier 1004.

The output of the first differential amplifier 1004 represents the gains of the replica amplifiers 1002a, 1002b, which are assumed to be equal and also equal to the gain of the PA 902. The output signal represents gain because the DC input signals are assumed to be known and accurate. As an example, if +DC=1V+0.1V, and −DC=1V−0.1V, then the difference between the input voltages is equal to (1+0.1)−(1−0.1)=0.2V. If the gain of the replica amplifiers 1002a, 1002b is 10, then the difference of the outputs of the replica amplifiers 1002a, 1002b is 10×0.2=2V. If the gain of the replica amplifiers 1002a, 1002b increases to 11 due to self-heating of the PA 902, then this output difference would increase to 2.2V. This difference voltage (that represents gain) is then compared to Vref in the second differential amplifier 1006 to determine if the difference value is too high or too low.

As with FIG. 9, the mapping and Gain control circuit 908 generates a suitable GC signal back to the PA 902 and the replica amplifiers 1002a, 1002b to boost their respective Gains in an amount sufficient to substantially offset the droop. The configuration of FIG. 10 thus allows determining the small-signal response of the replica amplifiers 1002a, 1002b by using DC measurements only. A variant of this architecture can also utilize a S&H circuit (not shown) in a similar fashion to the architecture described above for the S&H circuit variant of FIG. 9.

Placement of Temperature Sensing Circuits

Figure 11:
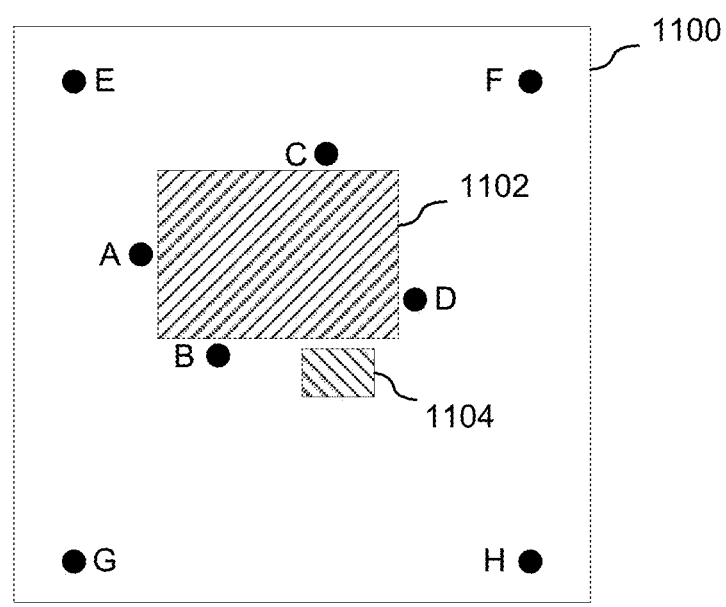
FIG. 11 is a top plan view of an example layout of an IC that includes a PA.

A particular power amplifier IC may include one or more temperature sensors for measuring PA self-heating during pulsed operation, and may include one or more temperature sensors for purposes of continuous temperature compensation. FIG. 11 is a top plan view of an example layout of an IC 1100 that includes a PA. This example includes a main region 1102 encompassing the circuitry for a PA, and a secondary region 1104 encompassing the circuitry for a replica amplifier. Shown are several possible locations A-D for PA pulsed-operation self-heating temperature sensors in close proximity to the main PA region 1102. Also shown are several possible locations E-H for continuous temperature compensation temperature sensors. Other locations and fewer or more locations may be used for either kind of temperature sensor. As described above, one or more replica amplifiers within the secondary region 1104 may also be used for indirect measurement of the self-heating of a PA in the adjacent main region 1102.

In many PA's having two amplifier stages, the final stage may generate as much as 80% of the PA heat, with the remainder of the PA heat generated by the driver stage. Accordingly, it is generally beneficial to place a PA pulsed-operation self-heating temperature sensor in close proximity to the final stage.

Close proximity of PA pulsed-operation self-heating temperature sensors to the power-consuming elements of a PA is important. While the concepts disclosed above work with sensor locations spaced away from a PA, distance increases the response time of measurement and hence introduces a lag in generation of a corrective GC signal.

In some applications, it may be useful to fabricate temperature sensors in multiple locations, such as locations A-H, and then determine which sensors in specific locations provide better performance (e.g., faster responding, better accuracy, stronger output signal, etc.). For example, in one test IC, 16 PA pulsed-operation self-heating temperature sensors were used to investigate optimal siting. Thereafter, the output from the selected sensors may be coupled to circuitry for compensating for PA self-heating during pulsed operation, or to suitable general continuous temperature compensation circuitry, as described above.

In other applications, it may be useful to include the output of several temperature sensors in determining a GC signal and/or a Continuous GC signal. For example, the output of the temperature sensors at locations A and B in FIG. 11 around the periphery of the main PA region 1102 could be determined (and scaled or weighted, if necessary) so as to provide an average of self-heating temperatures for the main PA region 1102.

When utilizing two or more continuous temperature sensing circuits 800 to determine $\Delta T = T(p) - T(d)$, as described above, a proximate location such as A-D may be paired with a distant location E-H.

Methods

Figure 12A:
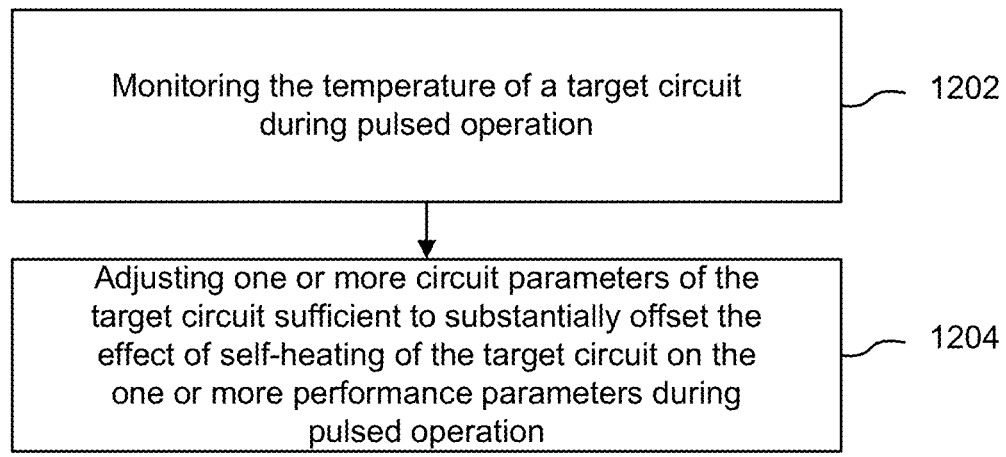
FIG. 12A is a process flow diagram of a first method for temperature compensating a target circuit having one or more performance parameters affected by self-heating during pulsed operation of the target circuit.

Another aspect of the invention includes methods for temperature compensating a target circuit having one or more performance parameters affected by self-heating during pulsed operation of the target circuit. For example, FIG. 12A is a process flow diagram 1200 of a first method for temperature compensating a target circuit having one or more performance parameters affected by self-heating during pulsed operation of the target circuit. The method steps include: monitoring the temperature of the target circuit during pulsed operation (STEP 1202); and adjusting one or more circuit parameters of the target circuit sufficient to substantially offset the effect of self-heating of the target circuit on the one or more performance parameters during pulsed operation (STEP 1204).

Figure 12B:
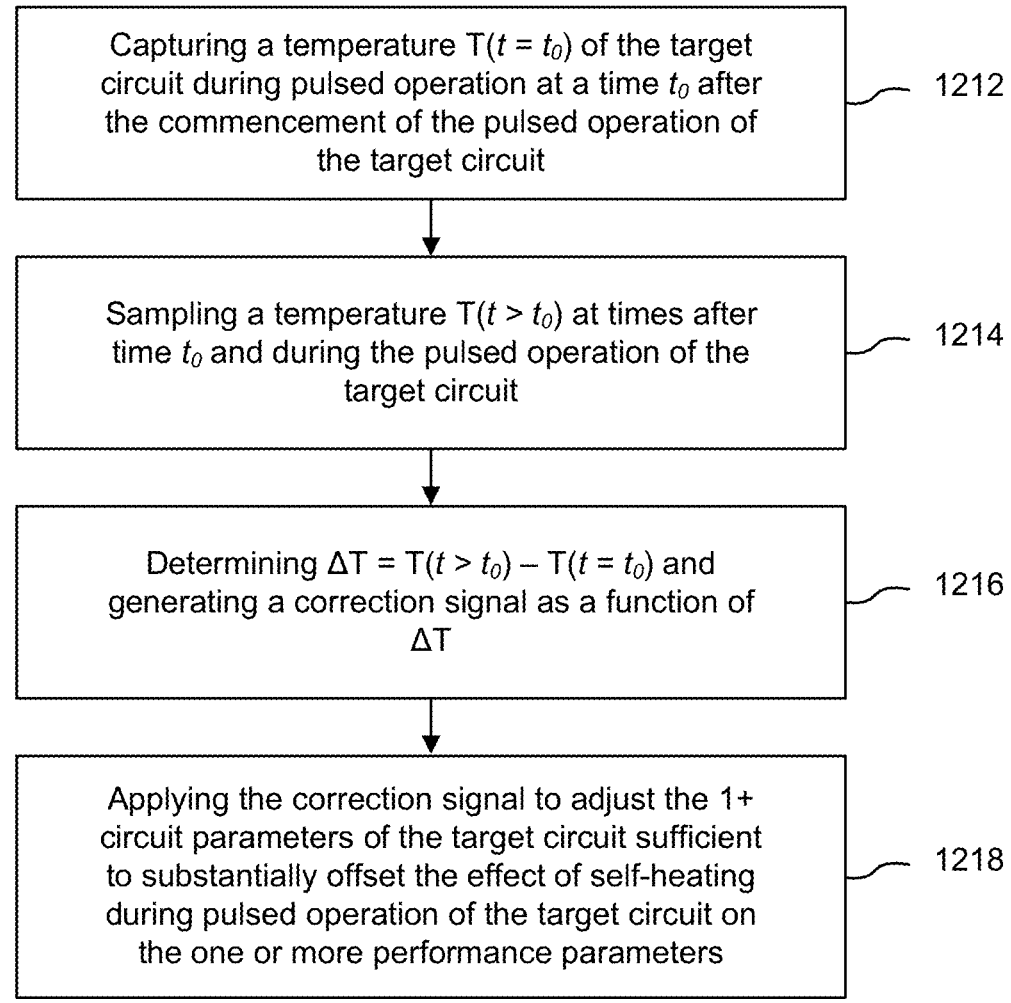
FIG. 12B is a process flow diagram of a second method for temperature compensating a target circuit having one or more performance parameters affected by self-heating during pulsed operation of the target circuit.

As another example, FIG. 12B is a process flow diagram 1210 of a second method for temperature compensating a target circuit having one or more performance parameters affected by self-heating during pulsed operation of the target circuit. The method steps include: capturing a temperature $T(t=t_0)$ of the target circuit during pulsed operation at a time to after the commencement of the pulsed operation of the target circuit (STEP 1212); sampling a temperature $T(t>t_0)$ at times after time $t_0$ and during the pulsed operation of the target circuit (STEP 1214); determining $\Delta T = T(t>t_0) - T(t=t_0)$ and generating a correction signal as a function of $\Delta T$ (STEP 1216); and applying the correction signal to adjust the one or more circuit parameters of the target circuit sufficient to substantially offset the effect of self-heating during pulsed operation of the target circuit on the one or more performance parameters (STEP 1218).

Figure 12C:
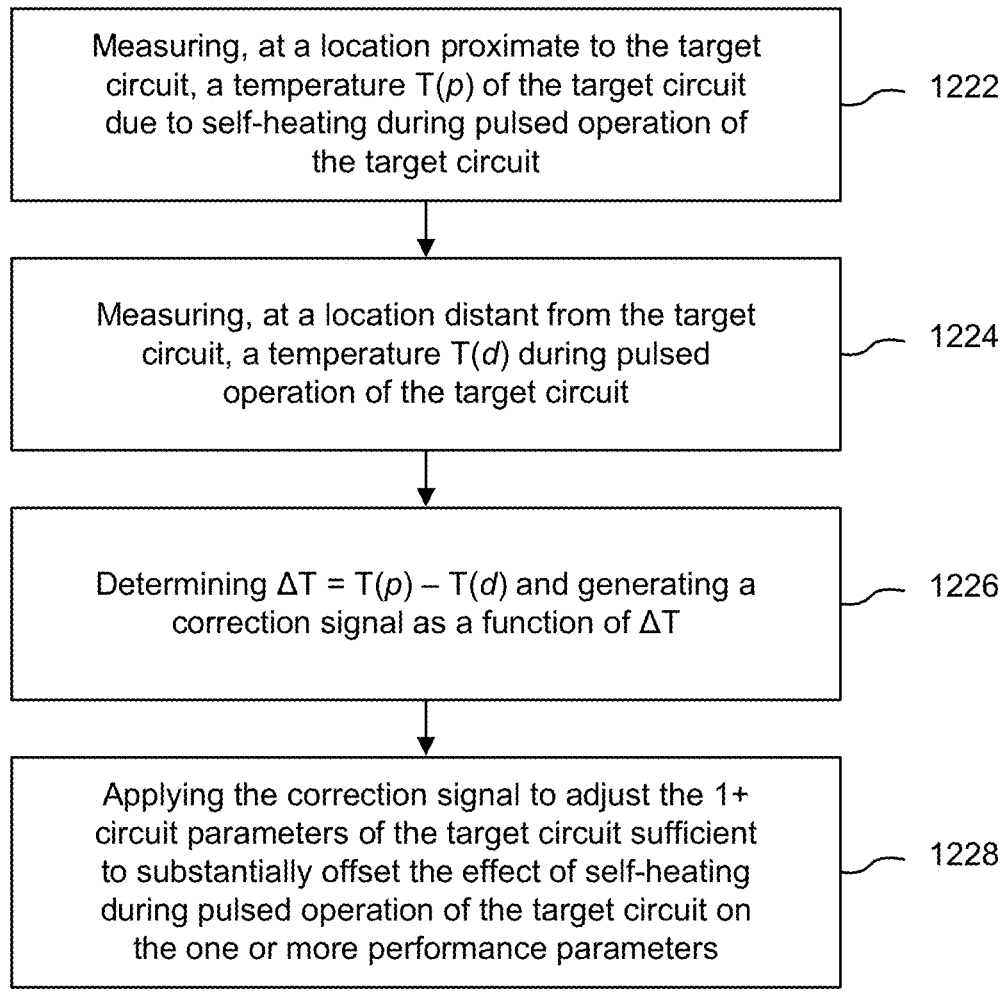
FIG. 12C is a process flow diagram of a third method for temperature compensating a target circuit having one or more performance parameters affected by self-heating during pulsed operation of the target circuit.

As yet another example, FIG. 12C is a process flow diagram 1220 of a third method for temperature compensating a target circuit having one or more performance parameters affected by self-heating during pulsed operation of the target circuit. The method steps include: measuring, at a location proximate to the target circuit, a temperature $T(p)$ of the target circuit due to self-heating during pulsed operation of the target circuit (STEP 1222); measuring, at a location distant from the target circuit, a temperature $T(d)$ during pulsed operation of the target circuit (STEP 1224); determining $\Delta T = T(p) - T(d)$ and generating a correction signal as a function of $\Delta T$ (STEP 1226); and applying the correction signal to adjust the one or more circuit parameters of the target circuit sufficient to substantially offset the effect of self-heating during pulsed operation of the target circuit on the one or more performance parameters (STEP 1228).

Variations of the above methods include sampling and holding $T(d)$ near the commencement of pulsed operation; the target circuit including a power amplifier and one of the performance parameters being at least one of a Gain or output power of the power amplifier during pulsed operation of the power amplifier; the target circuit including a power amplifier having at least one amplifier stage configured to receive an input radio frequency signal and output an amplified radio frequency signal, and the correction signal adjusting at least one of: a bias circuit for one or more amplifier stages; one or more impedance matching networks affecting the input radio frequency signal and/or the amplified radio frequency signal; one or more auxiliary amplifier stages for amplifying the input radio frequency signal and/or the amplified radio frequency signal; one or more attenuation circuits affecting the amplitude of the input radio frequency signal and/or the amplified radio frequency signal; one or more voltage and/or current supply circuits within or to the power amplifier.

Figure 12D:
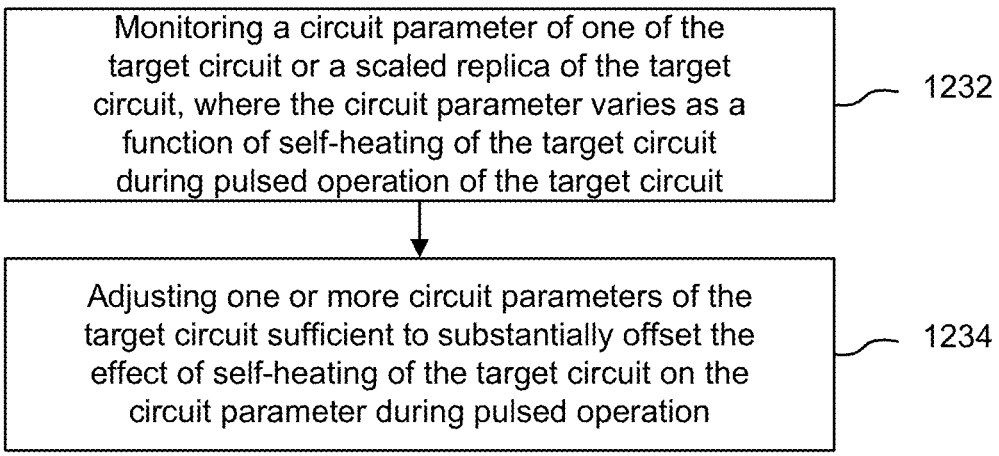
FIG. 12D is a process flow diagram of a method for temperature compensating a target circuit.

FIG. 12D is a process flow diagram 1230 of a method for temperature compensating a target circuit. The method includes: monitoring a circuit parameter of one of the target circuit or a scaled replica of the target circuit, where the circuit parameter varies as a function of self-heating of the target circuit during pulsed operation of the target circuit (STEP 1232); and adjusting one or more circuit parameters of the target circuit sufficient to substantially offset the effect of self-heating of the target circuit on the circuit parameter during pulsed operation (STEP 1234). A variation of this method includes the target circuit including a power amplifier and the monitored circuit parameter being a Gain of one of the power amplifier or at least one scaled replica of the power amplifier during pulsed operation of the power amplifier.

Figure 12E:
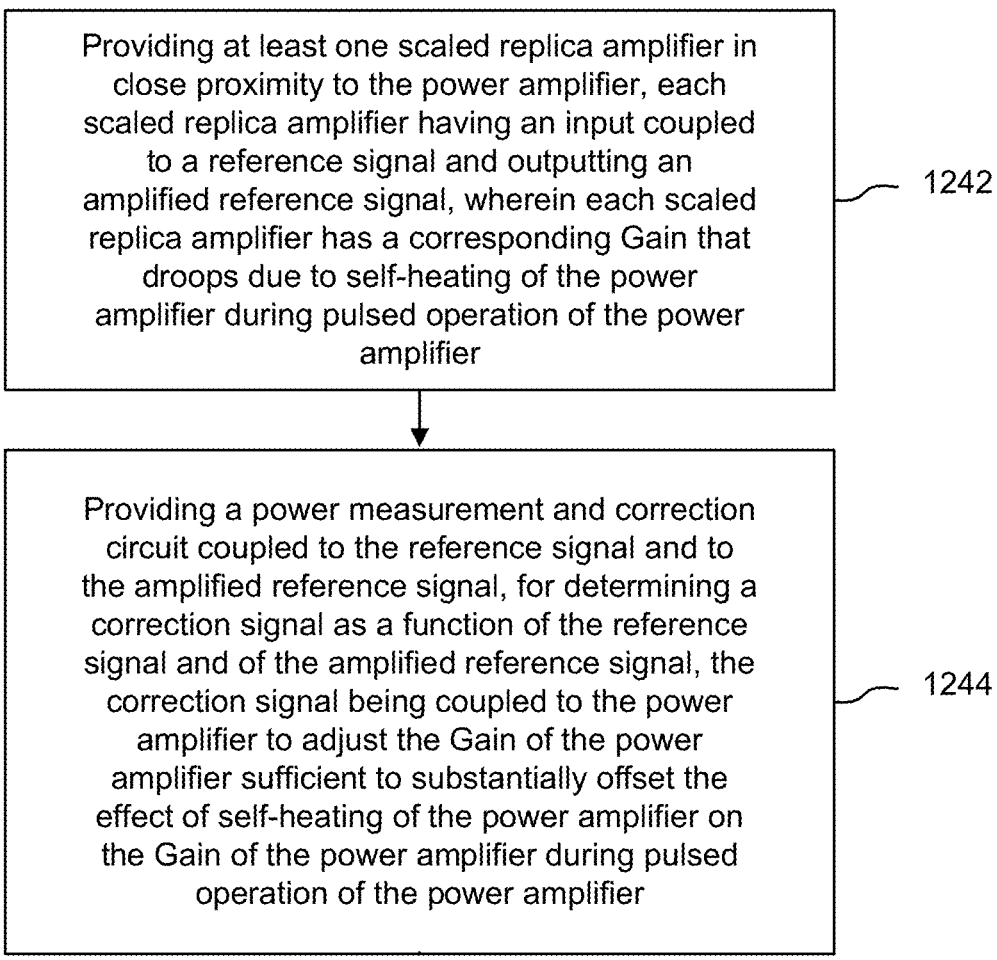
FIG. 12E is a process flow diagram of a method for temperature compensating an integrated circuit including (1) a power amplifier having a corresponding Gain that droops due to self-heating of the power amplifier during pulsed operation and (2) a temperature compensation circuit.

FIG. 12E is a process flow diagram 1240 of a method for temperature compensating an integrated circuit including (1) a power amplifier having a corresponding Gain that droops due to self-heating of the power amplifier during pulsed operation and (2) a temperature compensation circuit. The method includes: providing at least one scaled replica amplifier in close proximity to the power amplifier, each scaled replica amplifier having an input coupled to a reference signal and outputting an amplified reference signal, wherein each scaled replica amplifier has a corresponding Gain that droops due to self-heating of the power amplifier during pulsed operation of the power amplifier (STEP 1242); and providing a power measurement and correction circuit coupled to the reference signal and to the amplified reference signal, for determining a correction signal as a function of the reference signal and of the amplified reference signal, the correction signal being coupled to the power amplifier to adjust the Gain of the power amplifier sufficient to substantially offset the effect of self-heating of the power amplifier on the Gain of the power amplifier during pulsed operation of the power amplifier (STEP 1244).

Temperature Compensated Power Amplifier

Other variations of the circuits described above are encompassed by the invention. For example, FIG. 13 is a schematic diagram 1300 of another embodiment of an analog temperature sensor and sample-and-hold circuit in combination with a power amplifier having a current mirror circuit and a cascode bias circuit.

Figure 13:
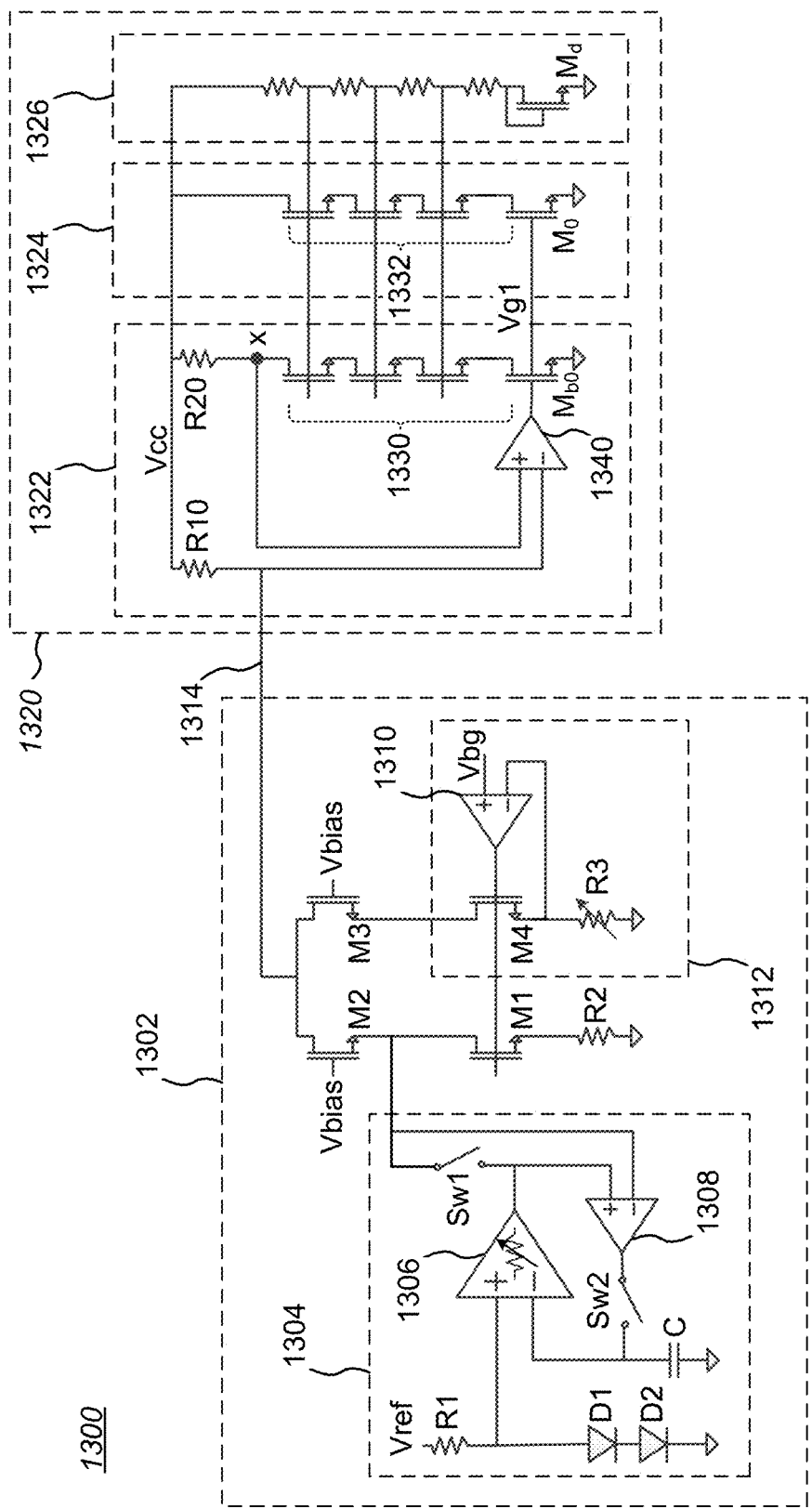
FIG. 13 is a schematic diagram of another embodiment of an analog temperature sensor and sample-and-hold circuit in combination with a power amplifier having a current mirror circuit and a cascode bias circuit.

In the example illustrated in FIG. 13, a temperature compensated variable current source circuit 1302 includes a sensor and tracking circuit 1304 (also referred to as a "sample-and-hold" in some embodiments). The tracking circuit 1304 is similar to the circuit shown in FIG. 6A, but has several variations. For example, the single diode D of FIG. 6A has been replaced by two series-connected (i.e., "stacked") diodes D1, D2 to provide better voltage range and resolution; more than two diodes may be used if needed. Stacked diodes increase the voltage supplied to a first input of a primary differential amplifier 1306, which makes design and operation of the differential amplifier 1306 easier. In addition, stacked diodes reduces sensitivity to storage capacitor leakage. As with the circuit of FIG. 6a, if the diodes D1, D2 are fabricated in reasonably close proximity to an amplifier stage of a power amplifier (PA), the node between the resistor R1 and the diodes D1, D2 will have a voltage Vt that varies as a function of the temperature of the amplifier stage (see the disclosure above regarding placement of temperature sensor circuits). The resistor R1 is coupled to a regulated voltage, Vref (e.g., 2.4V).

As another example of variation, the differential amplifier 1306 may be an operational transconductance amplifier (OTA), which produces an output current from differential input voltages. In some embodiments, the differential amplifier 1306 may include a resistive digital-to-analog converter (RDAC) for selectively regulating the output of the differential amplifier 1306. As is known in the art, an RDAC is a digitally-controlled electronic component that mimics the analog functions of a potentiometer (hence the variable resistor symbol inside the symbol for the differential amplifier 1306 in FIG. 13), and is often used for trimming and/or scaling analog signals.

As yet another variation, the sensor and sample-and-hold (S&H) circuit 1304 includes a second differential amplifier 1308 having a first input coupled directly to the output of the differential amplifier 1306 and to a first "near" terminal of an output switch Sw1, and a second input directly to a second "far" terminal of the output switch Sw1. The output of the second differential amplifier 1308 is coupled through a sampling switch Sw2 to a node between a storage capacitor C and a second input of the differential amplifier 1306. Both switches Sw1, Sw2 may be implemented as FET switch devices, which have an ON state resistance, $R_{ON}$, and an OFF state capacitance, $C_{OFF}$. The second differential amplifier 1308 keeps the voltage on both sides of the output switch Sw1 constant to improve accuracy, as described in greater detail below.

In operation, the states of the two switches Sw1, Sw2 are set to essentially mimic the 3-terminal switch 608 of FIG. 6A. Thus, referring to FIG. 13, when Sw1 is OPEN and Sw2 is CLOSED in an initial state, the output of the differential amplifier 1306 is coupled (i.e., through the second differential amplifier 1308) to the node between the storage capacitor C and the second input of the differential amplifier 1306. As a consequence, the storage capacitor C will be charged up until both inputs to the differential amplifier 1306 are equal to Vt, the voltage representing the momentary temperature of an associated amplifier stage of a PA. More precisely, for the case where the differential amplifier 1306 is an OTA, the voltage on the positive input will be Vt, but the voltage on the negative input (and on the storage capacitor C) will be the combination of Vt and the inverse of the cumulative offsets (imbalances) in the differential amplifier 1306 required to set its output current to zero (once the voltage on the storage capacitor C settles to a static value, no current can flow). Accordingly, the tracking circuit 1304 in effect calibrates out all of its offsets during the Sampling phase, and the storage capacitor C is in essence constantly tracking the temperature of the associated PA.

After a short delay (e.g., about 5-10 µS), a Hold signal sets Sw2 to OPEN while Sw1 remains OPEN, thus decoupling the output of the differential amplifier 1306 and thereby uncoupling the storage capacitor C from any further input from the differential amplifier 1306 (again, as conveyed through the second differential amplifier 1308); this transition provides a non-overlapping switching sequence to reduce sampling errors. At the moment of assertion of the Hold signal, $t_0$, the storage capacitor C has a charge that represents the temperature $T(t=t_0)$ of the associated PA amplifier stage (as well as any associated tracking circuit 1304 offsets, so as to effectively dynamically calibrate out such offsets as noted above). Thus, uncoupling the output of the differential amplifier 1306 a brief (e.g., 0.1-1 µS) transition period allows the circuitry to settle to a new state—thus avoiding transients—while preserving the sampled charge on the storage capacitor C.

Thereafter, a Monitor signal sets Sw1 to CLOSED while Sw2 remains OPEN. When the tracking circuit 1304 is in this configuration, one input of the differential amplifier 1306 is the stored charge (voltage) on the storage capacitor C, representing $T(t=t_0)$, while the other input of the differential amplifier 1306 is Vt, representing $T(t>t_0)$—that is, the continuously measured temperature of the PA. The output of the differential amplifier 1306 is ΔT, which represents the difference between the initial temperature $T(t=t_0)$ and the subsequently measured PA operating temperature $T(t>t_0)$ as the PA self-heats during operation.

The output of the differential amplifier 1306 is selectively coupled through the output switch Sw1 to an input node of a bias correction circuit comprising FETs M1-M4, resistor R2, variable resistor R3 (e.g., an RDAC), and a differential amplifier 1310, coupled as shown in a current mirror configuration. The gates of FETs M2 and M3 are coupled to bias voltages, Vbias (e.g., 2.4V). A first input of the differential amplifier 1310 is coupled to a reference voltage Vbg, such as from a band-gap voltage reference, which is a temperature-independent voltage reference circuit widely used in ICs that produces an essentially constant voltage regardless of power supply variations, temperature changes, and load. A second input of the differential amplifier 1310 is coupled to a node between FET M4 and variable resistor R3. The output of the differential amplifier 1310 is coupled to the gates of FETs M4 and M1. The differential amplifier 1310, the variable resistor R3, and FET M4 form a constant (but settable) current source 1312, with an output current equal to Vbg/R3. The constant current source 1312 is used to set a desired average current output for the bias correction circuit. This average current is then summed with the current from the tracking circuit 1304 by connecting the drains of the cascode FETs M2 and M3 together to generate an output 1314 that is a function of ΔT. This approach makes sure that the tracking circuit 1304 cannot decrease the average current below the current set by the constant current source 1312.

The operation of the second differential amplifier 1308 can be better understood in light of the above details regarding the configuration of the bias correction circuit. The output of the differential amplifier 1306 in an OTA configuration is a high impedance, as is the drain of the FET. FET M2 is in a cascode configuration and has a low input impedance, and thus sets the node voltage at the source of FET M2. The OTA differential amplifier 1306 output voltage on the "near" terminal of the output switch Sw1 and at the source of FET M2 (coupled to the "far" terminal of switch Sw1) will be at somewhat different voltages when the switch Sw1 transitions from an OPEN state to a CLOSED state, thus producing a transient that has to settle out. By adding the second differential amplifier 1308, this transient effect is largely removed. The second differential amplifier 1308 works to reduce the voltage across the open output switch Sw1. The input offset voltage to the OTA differential amplifier 1306 that makes this happen is stored on the storage capacitor C. The sampling switch Sw2 is then OPENED and the output switch Sw1 is CLOSED, resulting in greatly reduced transient events. The basic concept is to equalize voltages across switch Sw1 before and after the switching event. As should be apparent, a number of other circuit configurations may be used to accomplish this goal.

The summed output 1314 of the temperature compensated variable current source circuit 1302 is coupled to a power amplifier circuit 1322. In the illustrated example, the power amplifier circuit 1322 includes a cascode current mirror circuit 1322, a main amplifier circuit 1324, and a voltage divider bias circuit 1326. To avoid clutter, the input and output terminals of the main amplifier circuit 1324 and other circuit details are omitted. The cascode current mirror circuit 1322 may be, for example, a cascode amplifier of the type described in U.S. patent application Ser. No. 15/268,229, cited above, modified slightly to include input from the temperature compensated variable current source circuit 1302.

The cascode current mirror circuit 1322 includes a FET stack 1330 of at least two serially-connected FETs; similarly, the main amplifier circuit 1324 includes a FET stack 1332 of at least two serially-connected FETs (note that the stacks need not have the same number of FETs). In this example, the FETs in the FET stacks 1330, 1332 (except for the bottom or last FET $M_{b0}$, $M_0$ in each FET stack) are biased by voltages derived from the voltage divider bias circuit 1326. As shown in FIG. 13, the voltage divider bias circuit 1326 may comprise two or more series-connected resistors (not labeled), which may be terminated by a diode connected FET $M_d$. In some embodiments, separate voltage divider bias circuits may be provided for the cascode current mirror circuit 1322 and for the main amplifier circuit 1324.

The bottom or last FET $M_{b0}$, $M_0$ in each FET stack is biased from a common source, described below. The purpose of the cascode current mirror circuit 1322 is to essentially act as a current mirror that sees bias voltages similar to the main amplifier circuit 1324, with the FET stack 1330 of transistor devices in the cascode current mirror circuit 1322 being scaled-down replicas of the FET stack 1332 of transistor devices in the main amplifier circuit 1324.

The illustrated cascode current mirror circuit 1322 is modified from the examples described in U.S. patent application Ser. No. 15/268,229 by including a differential amplifier 1340 having a first input coupled to the output 1314 of the temperature compensated variable current source circuit 1302, and a second input coupled to a node "X" (which would be coupled directly to the gates of the last FETs $M_{b0}$, $M_0$ in each FET stack 1330, 1332 as a bias in the absence of the temperature compensated variable current source circuit 1302). In this example, the output of the differential amplifier 1340 is directly coupled as a bias voltage Vg1 to the gates of the last FETs $M_{b0}$, $M_0$ in each FET stack 1330, 1332; however, the coupling may be indirect, such as through a source follower circuit of the type described below with respect to FIG. 14. The output 1314 of the temperature compensated variable current source circuit 1302 is a function of $\Delta T$, which represents the difference between the initial temperature $T(t=t_0)$ and the subsequently measured PA operating temperature $T(t>t_0)$ as the PA self-heats during operation. Accordingly, any deviation of the output 1314 from the nominal bias current at node "X" will cause the differential amplifier 1340 to modify the bias voltage Vg1 supplied to the gates of the last FETs $M_{b0}$, $M_0$ in each FET stack 1330, 1332 to compensate for any measured $\Delta T$.

In greater detail, the cascode current mirror circuit 1322 uses the differential amplifier 1340 to adjust the gate voltage Vg1 applied to the gates of the last FETs $M_{b0}$, $M_0$ in each FET stack 1330, 1332 until the voltage drops across resistors R10 and R20 are equalized. The voltage across R10 is the resistance R10 times the current from the temperature compensated variable current source circuit 1302, and the voltage across R20 is the resistance R20 times the current in the FET stack 1330 of the cascode current mirror circuit 1322 (i.e., the replica amplifier stack). Note that the currents in any FET stack 1330, 1332 can be set to any ratio of the input reference current from the temperature compensated variable current source circuit 1302 by choosing the ratio of FET device widths for the two FET stacks 1330, 1332 and also by scaling the resistors R10 and R20.

As should be readily apparent, the temperature compensated variable current source circuit 1302 may be used in conjunction with other power amplifier configurations, including the other PA circuits described in U.S. patent application Ser. No. 15/268,229. Additional examples and details of bias circuit details are described in U.S. patent application Ser. No. 15/279,274, filed Sep. 28, 2016, entitled "Bias Control for Stacked Transistor Configuration", and in U.S. Pat. No. 9,837,965, issued Dec. 5, 2017, entitled "Standby Voltage Condition for Fast RF Amplifier Bias", both of which are assigned to the assignee of the present invention, the entire contents of each of which are incorporated herein by reference.

Temperature Compensated Power Amplifier with Standby Mode

In some integrated circuits (ICs), it is very important to minimize transient effects, including capacitive charging and discharging as well as device transients such as floating body effects. In particular, in some ICs, it quite beneficial to avoid or mitigate creation of accumulated charge in a silicon-on-insulator (SOI) substrate (particularly an SOI substrate having a trap rich layer). This is particularly true for some RF power amplifier SOI ICs. [For a fuller discussion of accumulated charge and trap rich layers in SOI substrates, see U.S. patent application Ser. No. 15/600,579, filed May 19, 2017, entitled "Transient Stabilized SOI FETs", assigned to the assignee of the present invention, the entire contents of which are incorporated herein by reference.]

Some of the techniques to address such transient effects include circuits to minimize voltage changes when switching between active and standby modes, particularly for a power amplifier. For example, in a power amplifier (PA) circuit, current flow in some parts of the PA can be restricted when the PA is inactive (i.e., is in a standby mode), thus avoiding a fully OFF state for at least some FETs within the circuit. A temperature compensated variable current source circuit 1302 may be beneficially used with such PAs.

Figure 14:
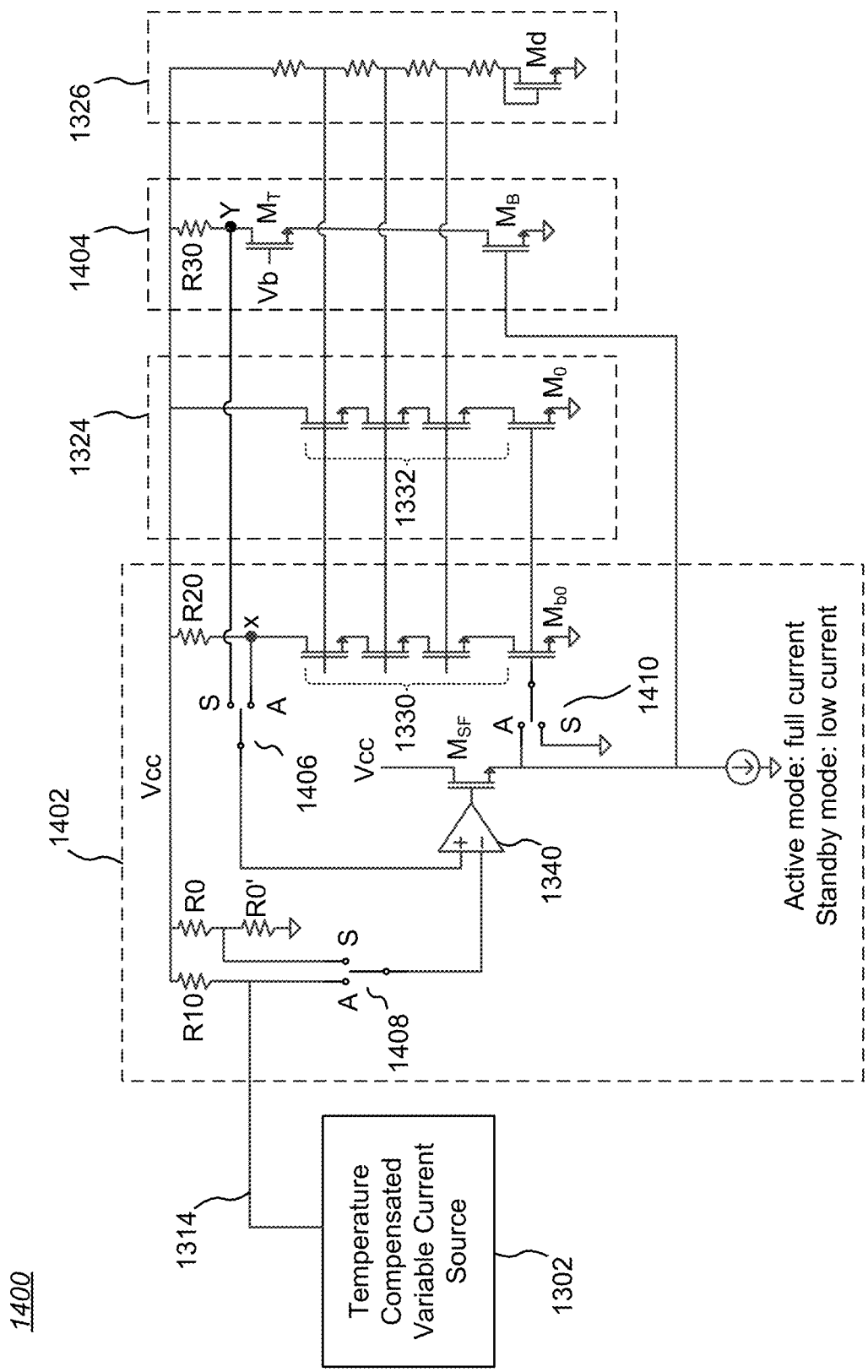
FIG. 14 is a schematic diagram of an example temperature compensated power amplifier having standby mode circuitry.

As one example, FIG. 14 is a schematic diagram 1400 of an example temperature compensated power amplifier having standby mode circuitry. The illustrated example is similar in many respects to the circuit shown in FIG. 13, and includes a temperature compensated variable current source circuit 1302 (simplified to a symbolic representation), a cascode current mirror circuit 1402, a main amplifier circuit 1324, and a voltage divider bias circuit 1326. An added circuit is a standby mode circuit 1404. In addition, the cascode current mirror circuit 1402 differs in some respects from the cascode current mirror circuit 1332 of FIG. 13.

The illustrated standby mode circuit 1404 includes a top FET $M_T$ that is conventionally biased, and a bottom FET $M_B$ that is biased from the cascode current mirror circuit 1402. The top FET $M_T$ prevents excessive drain-source voltage Vds across the bottom FET $M_B$. As should be clear, other numbers of FETs may be used in other embodiments of the standby mode circuit 1404.

The standby mode circuit 1404 is biased to provide a low current signal path (e.g., about 100 nA) that is always in circuit, but is biased into a low current state when the main amplifier circuit 1324 is switched OFF during periods in which signal amplification is not needed. A significant benefit of switching to the standby mode circuit 1404 alone is that doing so keeps FET node voltages constant between active and standby modes, since the less that certain node voltages of FETs within an SOI IC change, the more stable the charge that may accumulate as a result of circuit activity in the active layer of an IC.

To accomplish such a selection capability, the illustrated cascode current mirror circuit 1402 includes three switches 1406, 1408, 1410 that may be toggled between an active state A and a standby state S (note that the switch symbols are in neutral, unselected state for clarity of their switching function). When all of the switches 1406, 1408, 1410 are in the active state A, the configuration of the circuit as a whole is essentially identical to the circuit configuration shown in FIG. 13, with the exception that the standby mode circuit 1404 remains operative in a low current state, and the differential amplifier 1340 output is coupled to a source follower transistor $M_{SF}$, the output of which is coupled to the gates of the last FETs $M_{b0}$, $M_0$ in each stack 1330, 1332 (however, as noted above, the same or a similar source follower circuit may also be used in the circuit of FIG. 13).

In contrast, when all of the switches 1406, 1408, 1410 are in the standby state S, at least one of the gate inputs to the last FETs $M_{b0}$, $M_0$ in each stack 1330, 1332 is coupled to a fixed potential, such as circuit ground, sufficient to set the corresponding circuit (i.e., the cascode current mirror circuit 1402 and/or the main amplifier circuit 1324) to an OFF state with respect to input signal amplification (to be clear, portions of the cascode current mirror circuit 1402 may remain active in the standby state S to provide a bias to the standby mode circuit 1404, but the stack 1330 of the cascode current mirror circuit 1402 is rendered inactive, and the cascode current mirror circuit 1402 cannot respond to the temperature change output 1314 from the temperature compensated variable current source circuit 1302). In addition, the bias provided to the bottom FET $M_B$ of the standby mode circuit 1404 is provided through a different path that limits current through the standby mode circuit 1404. More specifically, instead of one input of the differential amplifier 1340 being coupled to resistor R10 and the output of the temperature compensated variable current source circuit 1302, and the other input of the differential amplifier 1340 being coupled to node "X", those inputs are switched in the standby state S to a low-current resistive divider RO, RO' and to a node "Y" of the standby mode circuit 1404, respectively. Thus, the temperature compensated variable current source circuit 1302 is disconnected from the cascode current mirror circuit 1402 in the standby state S.

The resistive divider RO, RO' uses high value resistors for low current consumption and sets a divided voltage that is close to the normal operating range in the active state (in one example embodiment, about $V_{CC}$–0.2V). By switching one input of the differential amplifier 1340 from node "X" to node "Y", the resistor R20 and the FET stack 1330 of the cascode current mirror circuit 1322 are replaced by a very low current version of the same thing, a resistor R30 and the FETs of the standby mode circuit 1404. This allows the cascode current mirror circuit 1402 to stay active in a closed loop mode of operation. Accordingly, the circuit of FIG. 14 avoids a fully OFF state for at least some FETs within the circuit, and keeps FET node voltages within the IC constant between active and standby modes.

Another technique would be to omit the standby mode circuit 1404, and keep the differential amplifier 1340 and source follower transistor $M_{SF}$ active in standby mode, but simply reduce the current in the source follower transistor $M_{SF}$ with suitable circuitry. The stack 1330 of the cascode current mirror circuit 1402 and the stack 1332 of the main amplifier circuit 1324 would thus remain biased and active, but at a reduced current level.

Notably, the combination of the techniques shown in FIG. 13 and, in particular, FIG. 14, results in a bias circuit that can meet challenging product requirements.

Methods Related to Temperature Compensated Power Amplifier

Figure 15:
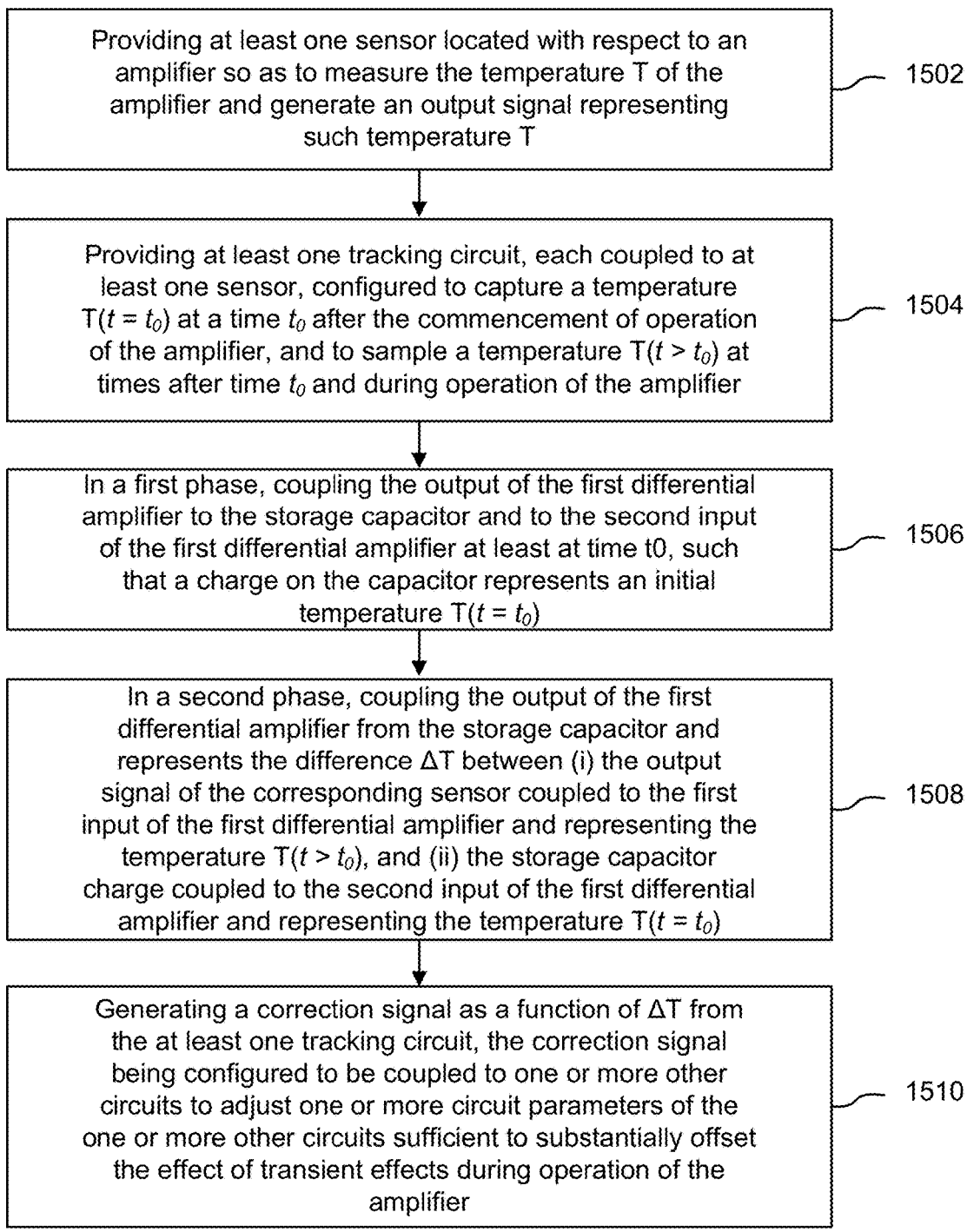
FIG. 15 is a process flow diagram of a first method for temperature compensating an integrated circuit, particularly a power amplifier.

Another aspect of the invention includes methods for temperature compensating an integrated circuit, particularly a power amplifier. For example, FIG. 15 is a process flow diagram 1500 of a first method for temperature compensating an integrated circuit, particularly a power amplifier. The method steps include: providing at least one sensor located with respect to an amplifier so as to measure the temperature T of the amplifier and generate an output signal representing such temperature T [STEP 1502]; providing at least one tracking circuit, each coupled to at least one sensor, configured to capture a temperature $T(t=t_0)$ at a time to after the commencement of operation of the amplifier, and to sample a temperature $T(t>t_0)$ at times after time to and during operation of the amplifier, the at least one tracking circuit including: (a) a first differential amplifier having a first input coupled to the output signal of a corresponding sensor, a second input, and an output representing the difference between signals applied to the first input and the second input of the first differential amplifier; (b) an output switch having a first terminal coupled to the output signal of the first differential amplifier, and having a second terminal configured to be coupled to a bias correction circuit; (c) a second differential amplifier having a first input coupled to the output signal of the first differential amplifier and the first terminal of the output switch, a second input coupled to the second terminal of the output switch, and an output representing the difference between signals applied to the first input and the second input of the second differential amplifier; (d) a sampling switch having a first terminal coupled to the output of the second differential amplifier and a second terminal coupled to the second input of the first differential amplifier; and (e) a storage capacitor coupled to the second input of the first differential amplifier and to the second terminal of the sampling switch [STEP 1504]; in a first phase, coupling the output of the first differential amplifier to the storage capacitor and to the second input of the first differential amplifier at least at time to, such that a charge on the capacitor represents an initial temperature $T(t=t_0)$ [STEP 1506]; in a second phase, coupling the output of the first differential amplifier from the storage capacitor and represents the difference $\Delta T$ between (i) the output signal of the corresponding sensor coupled to the first input of the first differential amplifier and representing the temperature $T(t>t_0)$, and (ii) the storage capacitor charge coupled to the second input of the first differential amplifier and representing the temperature $T(t=t_0)$ [STEP 1508]; and generating a correction signal as a function of $\Delta T$ from the at least one tracking circuit, the correction signal being configured to be coupled to one or more other circuits to adjust one or more circuit parameters of the one or more other circuits sufficient to substantially offset the effect of transient effects during operation of the amplifier [STEP 1510].

Additional aspects of the above method may include one or more of the following elements: the first differential amplifier being an operational transconductance amplifier; the operational transconductance amplifier including a resistive digital-to-analog converter for selectively regulating the output of the operational transconductance amplifier; least one sensor including a plurality of series-coupled diodes; the second differential amplifier equalizing voltages across the output switch before and after a switching event; configuring the correction signal to adjust a bias signal to the amplifier during operation of the amplifier; the transient effects including self-heating of the amplifier during operation of the amplifier; providing a constant current source for generating a selected average current output, and providing circuitry for summing the output of the first differential amplifier representing the difference ΔT with the average current output of the constant current source; and/or wherein the amplifier includes at least one amplifier stage configured to receive an input radio frequency signal and output an amplified radio frequency signal, and further including coupling the correction signal to and adjusting a bias circuit for one or more amplifier stages to substantially offset the effect of self-heating during operation of the amplifier on the Gain of the amplifier.

Further aspects of the above method may include one or more of the following elements: wherein the amplifier includes a main amplifier circuit including a stack of field effect transistors (FETs) having a last FET $M_0$, a cascode current mirror circuit coupled to the main amplifier circuit, and including a stack of FETs having a last FET $M_{b0}$, a first voltage divider bias circuit, coupled to the stack of FETs of the main amplifier circuit, a second voltage divider bias circuit, coupled to the stack of FETs of the cascode current mirror circuit, and a differential amplifier having a first input coupled to a node of the cascode current mirror circuit, a second input coupled to the correction signal from the correction circuit, and an output coupled, directly or indirectly, to bias the last FET $M_0$ and the last FET $M_{b0}$; and/or wherein the first voltage divider bias circuit and the second voltage divider bias circuit are the same circuit.

Further aspects of the above method may include one or more of the following elements: wherein the amplifier includes: a main amplifier circuit including a stack of field effect transistors (FETs) having a last FET $M_0$, a low-current standby mode circuit, a cascode current mirror circuit coupled to the main amplifier circuit, and including a stack of FETs having a last FET $M_{b0}$, a first voltage divider bias circuit, coupled to the stack of FETs of the main amplifier circuit, a second voltage divider bias circuit, coupled to the stack of FETs of the cascode current mirror circuit, a differential amplifier having a first input, a second input, and an output, a source follower circuit coupled to the output of the differential amplifier, and outputting a bias signal, a first switch configured to couple the first input of the differential amplifier to the correction signal of the correction circuit in an active state, and to a low-current resistive divider in a standby state, a second switch configured to couple the second input of the differential amplifier to a node of the cascode current mirror circuit in an active state, and to node of the low-current standby mode circuit in a standby state, and a third switch configured to couple the output bias signal of the source follower circuit to the last FET $M_0$ and the last FET $M_{b0}$ in an active state, and to set at least one of the main amplifier circuit and the cascode current mirror circuit to an OFF state with respect to input signal amplification in a standby state; and/or wherein the first voltage divider bias circuit and the second voltage divider bias circuit are the same circuit.

Figure 16:
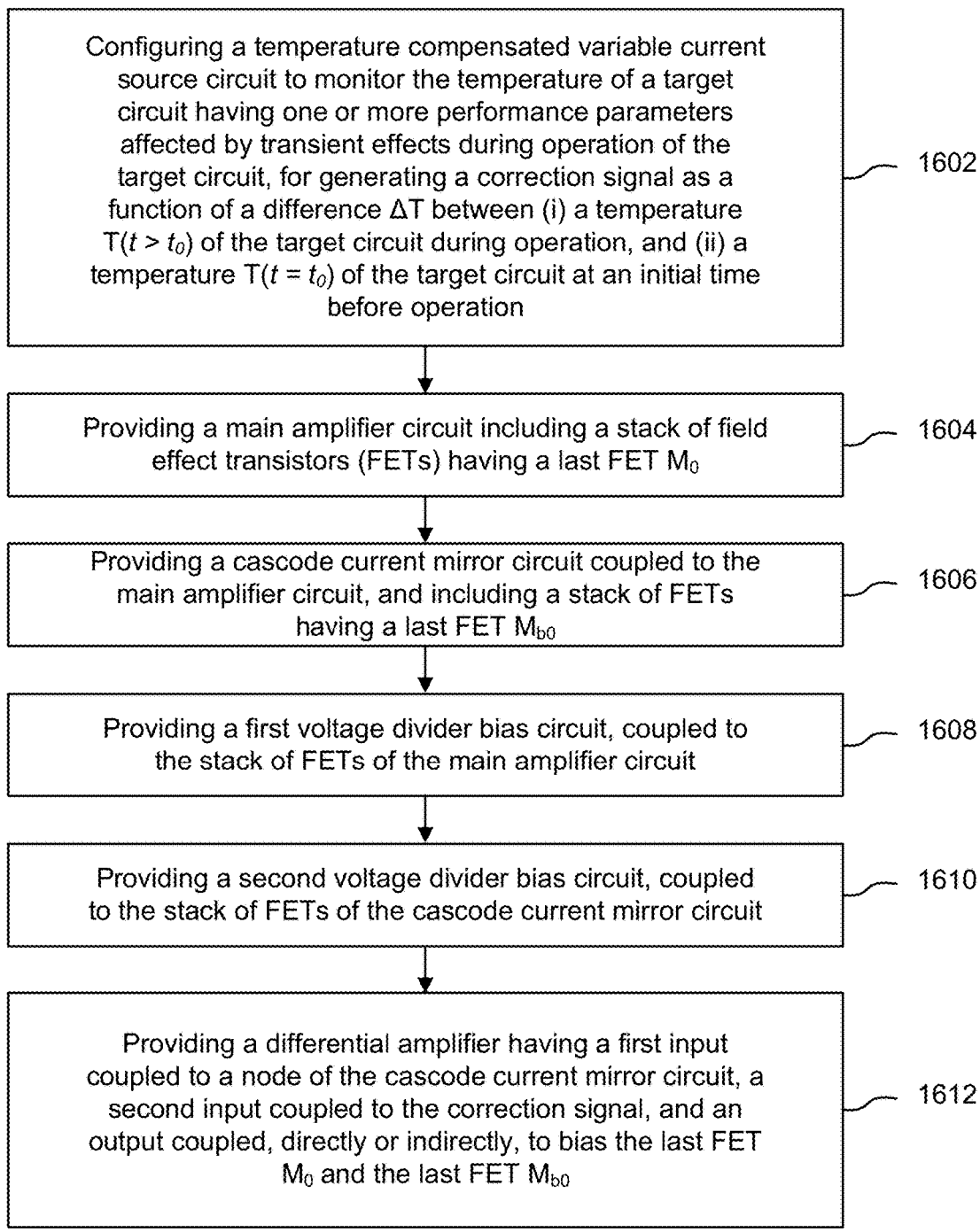
FIG. 16 is a process flow diagram of a second method for temperature compensating an integrated circuit, particularly a power amplifier.

As another example, FIG. 16 is a process flow diagram 1600 of a second method for temperature compensating an integrated circuit, particularly a power amplifier. The method steps include: configuring a temperature compensated variable current source circuit to monitor the temperature of a target circuit having one or more performance parameters affected by transient effects during operation of the target circuit, for generating a correction signal as a function of a difference ΔT between (i) a temperature $T(t>t_0)$ of the target circuit during operation, and (ii) a temperature $T(t=t_0)$ of the target circuit at an initial time before operation [STEP 1602]; providing a main amplifier circuit including a stack of field effect transistors (FETs) having a last FET $M_0$ [STEP 1604]; providing a cascode current mirror circuit coupled to the main amplifier circuit, and including a stack of FETs having a last FET $M_{b0}$ [STEP 1606]; providing a first voltage divider bias circuit, coupled to the stack of FETs of the main amplifier circuit [STEP 1608]; providing a second voltage divider bias circuit, coupled to the stack of FETs of the cascode current mirror circuit [STEP 1610]; and providing a differential amplifier having a first input coupled to a node of the cascode current mirror circuit, a second input coupled to the correction signal, and an output coupled, directly or indirectly, to bias the last FET $M_0$ and the last FET $M_{b0}$ [STEP 1612].

Figure 17A:
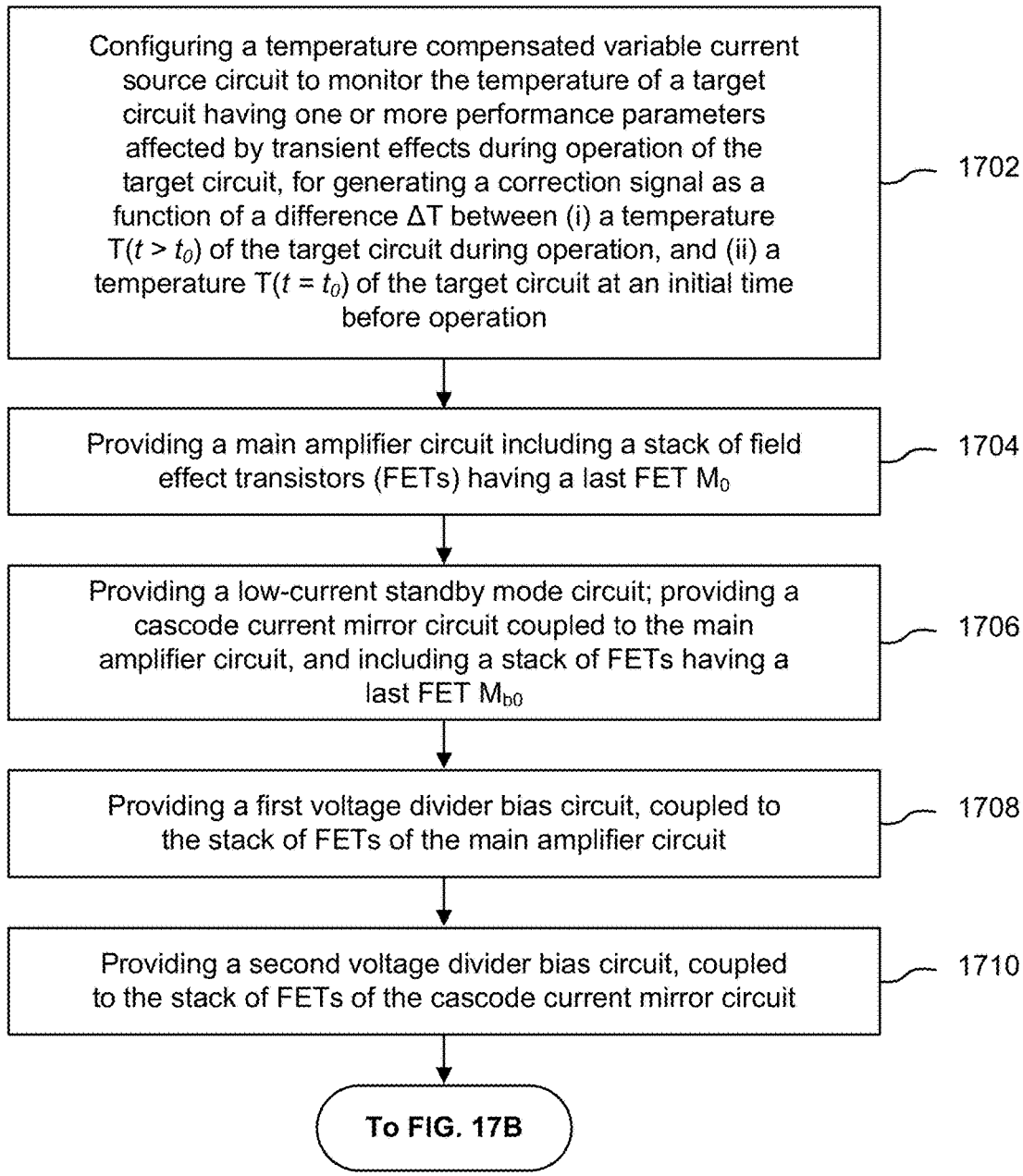
FIGS. 17A and 17B are a process flow diagram of a third method for temperature compensating an integrated circuit, particularly a power amplifier.
Figure 17B:
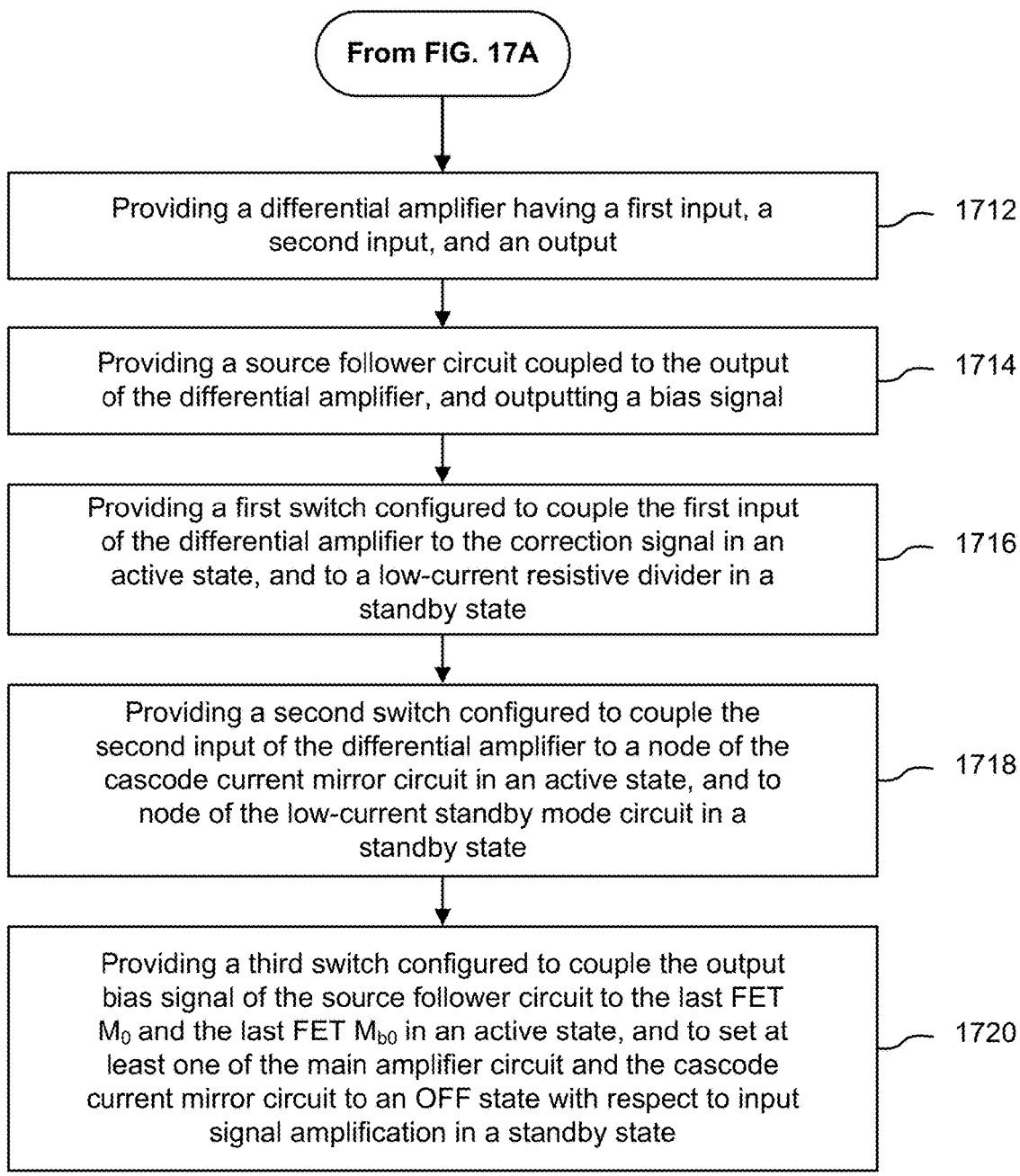

As yet another example, FIGS. 17A and 17B are a process flow diagram 1700 of a second method for temperature compensating an integrated circuit, particularly a power amplifier. The method steps include: configuring a temperature compensated variable current source circuit to monitor the temperature of a target circuit having one or more performance parameters affected by transient effects during operation of the target circuit, for generating a correction signal as a function of a difference ΔT between (i) a temperature $T(t>t_0)$ of the target circuit during operation, and (ii) a temperature $T(t=t_0)$ of the target circuit at an initial time before operation [STEP 1702]; providing a main amplifier circuit including a stack of field effect transistors (FETs) having a last FET $M_0$ [STEP 1704]; providing a low-current standby mode circuit; providing a cascode current mirror circuit coupled to the main amplifier circuit, and including a stack of FETs having a last FET $M_{b0}$ [STEP 1706]; providing a first voltage divider bias circuit, coupled to the stack of FETs of the main amplifier circuit [STEP 1708]; providing a second voltage divider bias circuit, coupled to the stack of FETs of the cascode current mirror circuit [STEP 1710]; providing a differential amplifier having a first input, a second input, and an output [STEP 1712]; providing a source follower circuit coupled to the output of the differential amplifier, and outputting a bias signal [STEP 1714]; providing a first switch configured to couple the first input of the differential amplifier to the correction signal in an active state, and to a low-current resistive divider in a standby state [STEP 1716]; providing a second switch configured to couple the second input of the differential amplifier to a node of the cascode current mirror circuit in an active state, and to node of the low-current standby mode circuit in a standby state [STEP 1718]; and providing a third switch configured to couple the output bias signal of the source follower circuit to the last FET Mo and the last FET $M_{b0}$ in an active state, and to set at least one of the main amplifier circuit and the cascode current mirror circuit to an OFF state with respect to input signal amplification in a standby state [STEP 1720].

Fabrication Technologies and Options

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 1 GHz, and particularly at the common WiFi frequencies of 2.4 GHz and 5 GHz, and even higher frequencies).

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A method for temperature compensating an integrated circuit, including:
    (a) providing at least one sensor located with respect to an amplifier so as to measure the temperature T of the amplifier and generate an output signal representing such temperature T;
    (b) providing at least one tracking circuit, each coupled to at least one sensor, configured to capture a temperature $T(t=t_0)$ at a time $t_0$ after the commencement of operation of the amplifier, and to sample a temperature $T(t>t_0)$ at times after time $t_0$ and during operation of the amplifier, the at least one tracking circuit including:
        (1) a first differential amplifier having a first input coupled to the output signal of a corresponding sensor, a second input, and an output representing the difference between signals applied to the first input and the second input of the first differential amplifier;
        (2) an output switch having a first terminal coupled to the output signal of the first differential amplifier, and having a second terminal configured to be coupled to a bias correction circuit;
        (3) a second differential amplifier having a first input coupled to the output signal of the first differential amplifier and the first terminal of the output switch, a second input coupled to the second terminal of the output switch, and an output representing the difference between signals applied to the first input and the second input of the second differential amplifier;
        (4) a sampling switch having a first terminal coupled to the output of the second differential amplifier and a second terminal coupled to the second input of the first differential amplifier; and
        (5) a storage capacitor coupled to the second input of the first differential amplifier and to the second terminal of the sampling switch;
    (c) in a first phase, coupling the output of the first differential amplifier to the storage capacitor and to the second input of the first differential amplifier at least at time $t_0$, such that a charge on the capacitor represents an initial temperature $T(t=t_0)$;
    (d) in a second phase, coupling the output of the first differential amplifier from the storage capacitor and represents the difference $\Delta T$ between (i) the output signal of the corresponding sensor coupled to the first input of the first differential amplifier and representing the temperature $T(t>t_0)$, and (ii) the storage capacitor charge coupled to the second input of the first differential amplifier and representing the temperature $T(t=t_0)$; and
    (e) generating a correction signal as a function of $\Delta T$ from the at least one tracking circuit, the correction signal being configured to be coupled to one or more other circuits to adjust one or more circuit parameters of the one or more other circuits sufficient to substantially offset the effect of transient effects during operation of the amplifier.

2. The method of claim 1, wherein the first differential amplifier is an operational transconductance amplifier.

3. The method of claim 2, wherein the operational transconductance amplifier includes a resistive digital-to-analog converter for selectively regulating the output of the operational transconductance amplifier.

4. The method of claim 1, wherein at least one sensor includes a plurality of series-coupled diodes.

5. The method of claim 1, wherein the second differential amplifier equalizes voltages across the output switch before and after a switching event.

6. The method of claim 1, further including configuring the correction signal to adjust a bias signal to the amplifier during operation of the amplifier.

7. The method of claim 1, wherein the transient effects include self-heating of the amplifier during operation of the amplifier.

8. The method of claim 1, further including:
    (a) providing a constant current source for generating a selected average current output; and
    (b) providing circuitry for summing the output of the first differential amplifier representing the difference $\Delta T$ with the average current output of the constant current source.

9. The method claim 1, wherein the amplifier includes at least one amplifier stage configured to receive an input radio frequency signal and output an amplified radio frequency signal, and further including coupling the correction signal to and adjusting a bias circuit for one or more amplifier stages to substantially offset the effect of self-heating during operation of the amplifier on the Gain of the amplifier.

10. The method of claim 1, wherein the amplifier includes:
   (a) a main amplifier circuit including a stack of field effect transistors (FETs) having a last FET $M_0$;
   (b) a cascode current mirror circuit coupled to the main amplifier circuit, and including a stack of FETs having a last FET $M_{b0}$;
   (c) a first voltage divider bias circuit, coupled to the stack of FETs of the main amplifier circuit;
   (d) a second voltage divider bias circuit, coupled to the stack of FETs of the cascode current mirror circuit; and
   (e) a differential amplifier having a first input coupled to a node of the cascode current mirror circuit, a second input coupled to the correction signal from the correction circuit, and an output coupled, directly or indirectly, to bias the last FET $M_0$ and the last FET $M_{b0}$.

11. The method of claim 10, wherein the first voltage divider bias circuit and the second voltage divider bias circuit are the same circuit.

12. The method of claim 1, wherein the amplifier includes:
   (a) a main amplifier circuit including a stack of field effect transistors (FETs) having a last FET $M_0$;
   (b) a low-current standby mode circuit;
   (c) a cascode current mirror circuit coupled to the main amplifier circuit, and including a stack of FETs having a last FET $M_{b0}$;
   (d) a first voltage divider bias circuit, coupled to the stack of FETs of the main amplifier circuit;
   (e) a second voltage divider bias circuit, coupled to the stack of FETs of the cascode current mirror circuit;
   (f) a differential amplifier having a first input, a second input, and an output;
   (g) a source follower circuit coupled to the output of the differential amplifier, and outputting a bias signal;
   (h) a first switch configured to couple the first input of the differential amplifier to the correction signal of the correction circuit in an active state, and to a low-current resistive divider in a standby state;
   (i) a second switch configured to couple the second input of the differential amplifier to a node of the cascode current mirror circuit in an active state, and to node of the low-current standby mode circuit in a standby state; and
   (j) a third switch configured to couple the output bias signal of the source follower circuit to the last FET $M_0$ and the last FET $M_{b0}$ in an active state, and to set at least one of the main amplifier circuit and the cascode current mirror circuit to an OFF state with respect to input signal amplification in a standby state.

13. The method of claim 12, wherein the first voltage divider bias circuit and the second voltage divider bias circuit are the same circuit.

14. A method for temperature compensating an integrated circuit, including:
   (a) configuring a temperature compensated variable current source circuit to essentially continuously monitor the temperature of a powered target circuit having one or more performance parameters affected by transient effects during operation of the target circuit, for generating a correction signal as a function of a difference $\Delta T$ between (i) a temperature $T(t>t_0)$ of the target circuit during operation, and (ii) a temperature $T(t=t_0)$ of the target circuit at an initial time before operation;
   (b) providing a main amplifier circuit including a stack of field effect transistors (FETs) having a last FET $M_0$;
   (c) providing a cascode current mirror circuit coupled to the main amplifier circuit, and including a stack of FETs having a last FET $M_{b0}$;
   (d) providing a first voltage divider bias circuit, coupled to the stack of FETs of the main amplifier circuit;
   (e) providing a second voltage divider bias circuit, coupled to the stack of FETs of the cascode current mirror circuit; and
   (f) providing a differential amplifier having a first input coupled to a node of the cascode current mirror circuit, a second input coupled to the correction signal, and an output coupled, directly or indirectly, to bias the last FET $M_0$ and the last FET $M_{b0}$.

* * * * *